United States Patent
Yamazaki et al.

(10) Patent No.: US 6,825,072 B2
(45) Date of Patent: Nov. 30, 2004

(54) METHOD OF MANUFACTURING A SEMICONDUCTOR DEVICE

(75) Inventors: Shunpei Yamazaki, Kanagawa-ken (JP); Hisashi Ohtani, Kanagawa-ken (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 404 days.

(21) Appl. No.: 10/044,926

(22) Filed: Jan. 15, 2002

(65) Prior Publication Data

US 2002/0090765 A1 Jul. 11, 2002

Related U.S. Application Data

(62) Division of application No. 09/172,300, filed on Oct. 14, 1998, now Pat. No. 6,348,368.

(30) Foreign Application Priority Data

Oct. 21, 1997 (JP) .............................................. 9-308043
May 16, 1998 (JP) ........................................... 10-152305

(51) Int. Cl.$^7$ .............................................. H01L 21/84
(52) U.S. Cl. ........................ 438/166; 438/486; 438/473
(58) Field of Search ................................ 438/166, 486, 438/473

(56) References Cited

U.S. PATENT DOCUMENTS

| | | | |
|---|---|---|---|
| 5,550,070 A | | 8/1996 | Funai et al. |
| 5,643,826 A | | 7/1997 | Ohtani et al. |
| 5,648,277 A | | 7/1997 | Zhang et al. |
| 6,124,154 A | | 9/2000 | Miyasaka |
| 6,140,166 A | * | 10/2000 | Ohtani et al. ................ 438/166 |
| 6,255,195 B1 | * | 7/2001 | Linn et al. ................... 438/473 |
| 6,444,534 B1 | * | 9/2002 | Maszara ..................... 438/311 |
| 6,639,245 B2 | * | 10/2003 | Gotoh et al. .................. 257/72 |
| 6,695,955 B2 | * | 2/2004 | Hwang et al. ......... 204/192.12 |

FOREIGN PATENT DOCUMENTS

| | | |
|---|---|---|
| JP | 05-109737 | 4/1993 |
| JP | 07-130652 | 5/1995 |
| JP | 07-135318 | 5/1995 |
| JP | 07-321339 | 12/1995 |
| JP | 08-078329 | 3/1996 |

OTHER PUBLICATIONS

R. Shimokawa and Y. Hayashi, "Characterization of High-Efficiency Cast–Si Solar Cell Wafers by MBIC Measurement", Japanese Journal of Applied Physics, vol. 27, No. 5, May, 1988, pp. 751–758.

* cited by examiner

*Primary Examiner*—Evan Pert
*Assistant Examiner*—Lisa Kilday
(74) *Attorney, Agent, or Firm*—Eric J. Robinson; Robinson Intellectual Property Law Office, P.C.

(57) ABSTRACT

In a method of manufacturing a semiconductor device, after a lateral growth region 107 is formed by using a catalytic element for facilitating crystallization of silicon, the catalytic element is gettered into a phosphorus added region 108 by a heat treatment. Thereafter, a gate insulating film 113 is formed to cover active layers 110 to 112 formed, and in this state, a thermal oxidation step is carried out. By this, the characteristics of an interface between the active layers and the gate insulating film can be improved while abnormal growth of a metal oxide is prevented.

8 Claims, 17 Drawing Sheets

5 nm 5 nm

⟨POINT 1⟩

50 nm 5 nm

⟨POINT 2⟩

50 nm 5 nm

⟨POINT 3⟩

50 nm 5 nm

METHOD OF MANUFACTURING A SEMICONDUCTOR DEVICE

BACKGROUND OF THE INVENTION

1. Field of the Invention

The present invention relates to a method of manufacturing a semiconductor device using a semiconductor thin film, and particularly to a method of manufacturing a semiconductor device constituted by a thin film transistor (TFT) using a crystalline silicon film.

In the present specification, the semiconductor device means any device functioning by using a semiconductor, and not only a simple component such as a TFT but also an electrooptical device, a semiconductor circuit, and an electronic equipment provided with those are contained in the semiconductor device.

2. Description of the Related Art

In recent years, a TFT used for an electrooptical device such as an active matrix type liquid crystal display device has been actively developed.

The active matrix type liquid crystal display device is a monolithic display device in which a pixel matrix circuit and a driver circuit are provided on the same substrate. Moreover, a system-on-panel having built-in logic circuits, such as a γ correction circuit, a memory circuit, and a clock generation circuit, has been also developed.

Since such a driver circuit and a logic circuit are required to perform high speed operation, it is improper to use an amorphous silicon film as an active layer. Thus, in the present circumstances, a TFT using a crystalline silicon film (polysilicon film) as an active layer has become the mainstream.

The present inventors et al. disclose the technique for obtaining a crystalline silicon film on a glass substrate in Japanese Patent Laid-Open 8-78329. In the technique disclosed in the publication, a catalytic element for facilitating crystallization is selectively added in an amorphous silicon film, and a heat treatment is carried out to form a crystalline silicon film extending from an added region.

According to this technique, a crystallizing temperature of an amorphous silicon film can be lowered by 50 to 100° C. by action of the catalytic element, and a time required for crystallization can also be reduced to ⅕ to ¹⁄₁₀. Since the crystallization of the silicon film progresses almost parallel to the surface of a substrate toward a lateral direction, the present inventors et al. refer to this crystallized region as a lateral growth region.

Since the catalytic element is not directly added in the lateral growth region, the region has a feature that the concentration of the catalytic element remaining in the film is low as compared with the case where the catalytic element is directly added. For example, although the content of the catalytic element is in the order of $10^{19}$ in the case of direct addition, the content in the lateral growth region is in the order of $10^{18}$ which is smaller by one figure.

Although it becomes possible to obtain a silicon film having excellent crystallinity by the above crystallizing technique at a relatively low temperature, since the catalytic element is included in the film, the control of the amount of the addition is subtle, and a problem has occurred in the reproducibility and stability (stability in electrical characteristics of a device obtained).

Besides, there has also occurred a problem that change of characteristics of the obtained semiconductor device with the lapse of time and the dispersion of OFF values (off current) as characteristic values of the TFT are large by the influence of the catalytic element remaining in the film.

SUMMARY OF THE INVENTION

An object of the present invention is to provide a semiconductor device with high performance by a TFT having excellent electrical characteristics and realized by removing a catalytic element remaining in a film as described above.

According to an aspect of the present invention, a method of manufacturing a semiconductor device comprises the steps of: adding a catalytic element for facilitating crystallization of an amorphous semiconductor film into a partial region or an entire surface on the amorphous semiconductor film; transforming the partial region or the entire surface of the amorphous semiconductor film into a crystalline semiconductor film by carrying out a first heat treatment; selectively adding an element selected from group 15 into the crystalline semiconductor film; gettering the catalytic element into a region added with the element selected from group 15 from a region adjacent to the added region by carrying out a second heat treatment; forming an active layer by patterning the crystalline semiconductor film; forming an insulating film covering the active layer; and carrying out a heat treatment in an oxidizing atmosphere after formation of the insulating film.

According to another aspect of the present invention, a method of manufacturing a semiconductor device comprises the steps of: selectively forming a mask insulating film on an amorphous semiconductor film; selectively adding a catalytic element for facilitating crystallization of the amorphous semiconductor film into the amorphous semiconductor film by using the mask insulating film; transforming at least a part of the amorphous semiconductor film into a crystalline semiconductor film by carrying out a first heat treatment; selectively adding an element selected from group 15 into the crystalline semiconductor film; gettering the catalytic element into a region added with the element selected from group 15 from a region adjacent to the added region by carrying out a second heat treatment; forming an active layer by patterning the crystalline semiconductor film; forming a gate insulating film covering the active layer; and carrying out a heat treatment in an oxidizing atmosphere after formation of the gate insulating film.

According to still another aspect of the present invention, a method of manufacturing a semiconductor device comprises the steps of: selectively forming a mask insulating film on an amorphous semiconductor film; selectively adding a catalytic element for facilitating crystallization of the amorphous semiconductor film into the amorphous semiconductor film by using the mask insulating film; transforming at least a part of the amorphous semiconductor film into a crystalline semiconductor film by carrying out a first heat treatment; selectively adding an element selected from group 15 into the crystalline semiconductor film by using the mask insulating film as it is; gettering the catalytic element into a region added with the element selected from group 15 from a region adjacent to the added region by carrying out a second heat treatment; forming an active layer by patterning the crystalline semiconductor film; forming a gate insulating film covering the active layer; and carrying out a heat treatment in an oxidizing atmosphere after formation of the gate insulating film.

According to still another aspect of the present invention, a method of manufacturing a semiconductor device comprises the steps of: selectively adding a catalytic element for facilitating crystallization of an amorphous semiconductor film into the amorphous semiconductor film; transforming the amorphous semiconductor film into a crystalline semiconductor film by carrying out a first heat treatment; selectively adding an element selected from group 15 into the crystalline semiconductor film; gettering the catalytic element into a region added with the element selected from group 15 from a region adjacent to the added region by carrying out a second heat treatment; forming an active layer by patterning the crystalline semiconductor film; forming an insulating film covering the active layer; and carrying out a heat treatment in an oxidizing atmosphere after formation of the insulating film.

DETAILED DESCRIPTION OF THE PREFERRED EMBODIMENTS

Figure 1A:
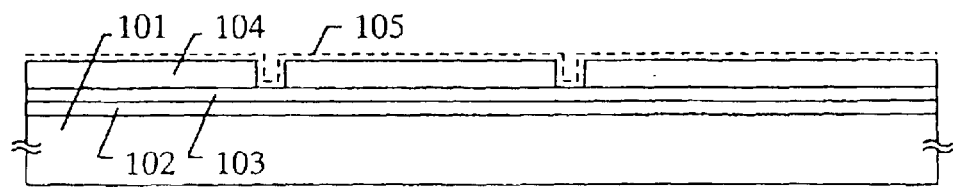
FIGS. 1A to 1E are views showing manufacturing steps of a thin film transistor of Embodiment 1.

Preferred embodiments of the present invention will now be described with reference to the drawings.

[Embodiment 1]

In this embodiment, description will be made to an example in which a driving circuit, a pixel matrix circuit, and a logic circuit are constituted by combining NTFTs and PTFTs formed on the same substrate to manufacture an active matrix type electrooptical device. FIGS. 1 to 3 will be used for the description.

First, a substrate 101 with high heat resistance (quartz substrate in this embodiment) is prepared, and an insulating silicon film 102 with a thickness of 300 nm is formed as an under film thereon. The insulating silicon film includes a silicon oxide film (SiOx), a silicon nitride film (SixNy), a silicon nitride oxide film (SiOxNy), or a lamination film thereof.

A silicon substrate may be used instead of the quartz substrate. In that case, the under film may be a thermal oxidation film.

If the distortion point is 750° C. or more, a glass substrate (material typically called crystallized glass, glass ceramics, or the like) may be used. In that case, if an under film is provided by a low pressure CVD method and the entire surface of the substrate is covered with an insulating silicon film, since an outflow of ingredients from the glass substrate can be suppressed, such a structure is effective. It is also possible to adopt such a means that the entire surface of the substrate is covered with an amorphous silicon film and the film is completely transformed into a thermal oxidation film.

After the substrate having the insulating surface is prepared in this way, an amorphous silicon film 103 is formed by the low pressure CVD method. It is appropriate that the thickness of the amorphous silicon film 103 is made 20 to 100 nm (preferably 40 to 75 nm). In this embodiment, the thickness of the film is made 65 nm. If it is possible to obtain the film quality comparable to the amorphous silicon film formed by the low pressure CVD method, a plasma CVD method may be used.

An amorphous semiconductor film (expressed by $Si_xGe_{1-x}$ (0<X<1)) in which germanium is contained in an amorphous silicon film may be used instead of the amorphous silicon film.

Next, a mask insulating film 104 having a thickness of 120 nm and made of a silicon oxide film is formed on the amorphous silicon film 103. An opening portion is provided in the mask insulating film 104 by patterning. This opening portion subsequently becomes an added region of a catalytic element.

Next, in accordance with the technique disclosed in Japanese Patent Laid-Open No. 8-78329, an adding step of a catalytic element for facilitating crystallization is carried out. In this embodiment, nickel is selected as the catalytic element, and an ethanol solution in which nickel acetate containing nickel of 10 ppm in weight is dissolved, is applied by a spin coating method.

Of course, instead of nickel, it is also possible to use one kind or plural kinds of elements selected from cobalt (Co), iron (Fe), palladium (Pd), platinum (Pt), copper (Cu), gold (Au), germanium (Ge), and lead (Pb).

In this way, a nickel containing layer 105 is formed on the surface of the mask insulating film 104. At this time, such a state is obtained that nickel is in contact with the amorphous silicon film 103 at the opening portion provided in the mask insulating film 104.

Figure 1B:
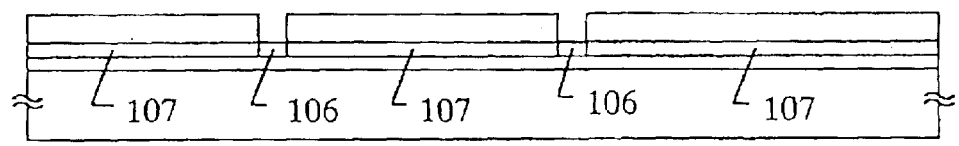

After the state shown in FIG. 1A is obtained in this way, dehydrogenating is carried out at about 450° C. for one hour, and then, a heat treatment is carried out in an inert gas atmosphere, a hydrogen atmosphere, or an oxygen atmosphere at 500 to 700° C. (typically 550 to 650° C., preferably 570° C.) for 4 to 24 hours so that the amorphous silicon film 103 is crystallized. In this embodiment, a heat treatment at 570° C. for 14 hours is carried out to progress crystallization (FIG. 1B).

At this time, the crystallization of the amorphous silicon film 103 progresses first from nuclei generated in a region (nickel added region) 106 added with nickel, so that a crystal region (lateral growth region) 107 grown almost parallel to the surface of the substrate 101 is formed. Since respective crystal grains in the lateral growth region 107 are gathered in a comparatively uniform state, the lateral growth region has a merit that the total crystallinity is superior.

After the crystallizing step is ended, P (phosphorus) is added by utilizing the mask insulating film 104 directly as a mask. It is preferable to add phosphorus in the added region so that the concentration of phosphorus becomes $1 \times 10^{19}$ to $1 \times 10$ atoms/cm (about ten times that of nickel).

The phosphorus is also implanted in the under film (including the substrate) of the phosphorus added region through the silicon film. Thus, phosphorus with a high concentration is included in only a specific region of the under film or the substrate. However, such phosphorus does not have a bad influence upon the TFT characteristics.

In the present invention, the gettering power of phosphorus is used to remove nickel remaining in the lateral growth region 107. Although other elements in group 15, such as arsenic and antimony, may be used other than phosphorus, it is desirable to use phosphorus having the high gettering ability.

In this embodiment, a phosphorus added region 108 is formed by some means of an ion implanting method such as an ion implantation method or a plasma doping method, a method of using diffusion from a vapor phase, and a method of using diffusion from a solid phase. Although a new opening portion may be provided by patterning again in the mask insulating film 104 which is utilized as a mask in the adding step of phosphorus, it is also possible to improve the throughput by using the mask insulating film 104 as it is.

Figure 1C:
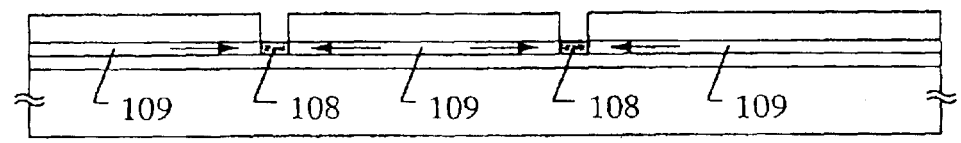
Figure 1D:
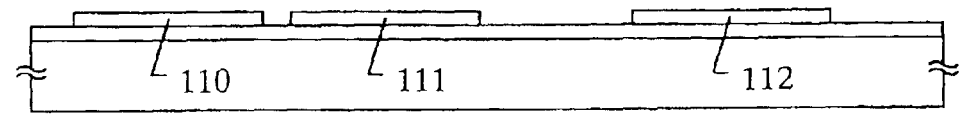
Figure 1E:
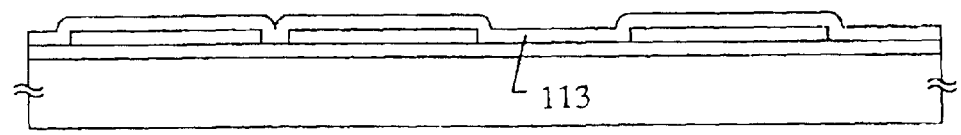

After the phosphorus added region 108 is formed, a heat treatment is carried out at 500 to 800° C. (preferably 600 to 650° C.) for 2 to 24 hours (preferably 8 to 15 hours) to move nickel in the lateral growth region into the phosphorus added region 108 (moving direction is indicated by arrows). In this way, a lateral growth region 109 in which the concentration of nickel is decreased to $5 \times 10^{17}$ atoms/cm$^3$ or less (preferably $2 \times 10^{17}$ atoms/cm$^3$) is obtained (FIG. 1C).

In the present circumstances, since the lower limit of detection by SIMS (Secondary Ion Mass Spectroscopy) is about $2 \times 10^{17}$ atoms/cm$^3$, it is impossible to investigate the concentration less than that. However, when the gettering step of this embodiment is carried out, it is inferred that the concentration is reduced down to at least about $1 \times 10^{14}$ to $1 \times 10^{15}$ atoms/cm$^3$.

After the gettering step of nickel is ended in this way, the mask insulating film 104 is removed, and then, active layers 110 to 112 are formed by using only the lateral growth region 109. At this time, it is desirable to completely remove the region 108 in which nickel was gettered. By this, it is possible to prevent nickel from reversely diffusing into the active layer again.

Next, a gate insulating film 113 made of an insulating silicon film is formed by a plasma CVD method or a low pressure CVD method so as to cover the active layers 110 to 112. It is appropriate that the thickness of this gate insulating film 113 is made 50 to 150 nm.

After the gate insulating film 113 is formed, a heat treatment is carried out in an oxidizing atmosphere at 800 to 1100° C. (preferably 950 to 1050° C.) to form a thermal oxidation film (not shown) at the interface between the active layers 110 to 112 and the gate insulating film 113.

The oxidizing atmosphere may be a dry $O_2$ atmosphere, a wet $O_2$ atmosphere, or an atmosphere containing a halogen element (typically hydrogen chloride). When the halogen element is contained, if the insulating film on the active layer is thin, the gettering effect for nickel by the halogen element can also be expected.

Figure 2A:
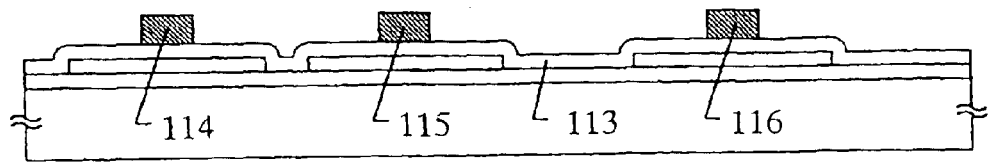
FIGS. 2A to 2D are views showing manufacturing steps of the thin film transistor of Embodiment 1.

It is appropriate that optimum conditions with respect to the temperature and time of the thermal oxidation step are determined in view of the thickness of the formed thermal oxidation film and the throughput. In this embodiment, the condition (950° C., 30 min) of forming the thermal oxidation film with a thickness of 50 nm is selected. At the same time, the active layer is decreased by 25 nm, and the final thickness of the active layer becomes 40 nm (FIG. 2A).

The structure that the thermal oxidation step is carried out after the gate insulating film is formed in this way is most important in the present invention. This is because if the active layers 110 to 112 are directly oxidized, there can occur a problem that the active layer is cut. This will be described below.

Nickel remaining in the active layer is sometimes segregated, and in that portion, nickel silicide is formed. In the state where a sufficient amount of oxygen is supplied, since nickel silicide has an oxidizing speed higher than silicon, nickel silicide is selectively oxidized by the heat treatment in the oxidizing atmosphere.

That is, nickel silicide is first oxidized to form an oxide indicated by SiOx, and nickel separated therefrom is again reacted with silicon to form nickel silicide. By this repetition, it is conceivable that the oxide with a head of nickel silicide grows abnormally in the film.

From this reason, when the active layer crystallized by using nickel as the catalytic element is oxidized in the state in which the active layer is in contact with the oxidizing atmosphere, the foregoing abnormal growth of the oxide occurs, so that the state where the active layer is divided at that portion can occur.

Figure 7A:
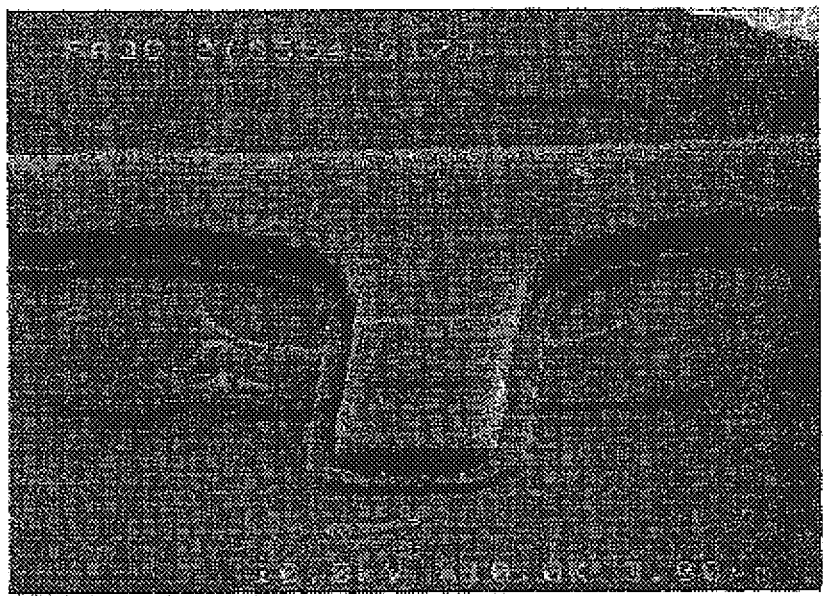
FIGS. 7A and 7B are SEM photographs showing the state of abnormal growth of SiOx of Embodiment 1.
Figure 7B:
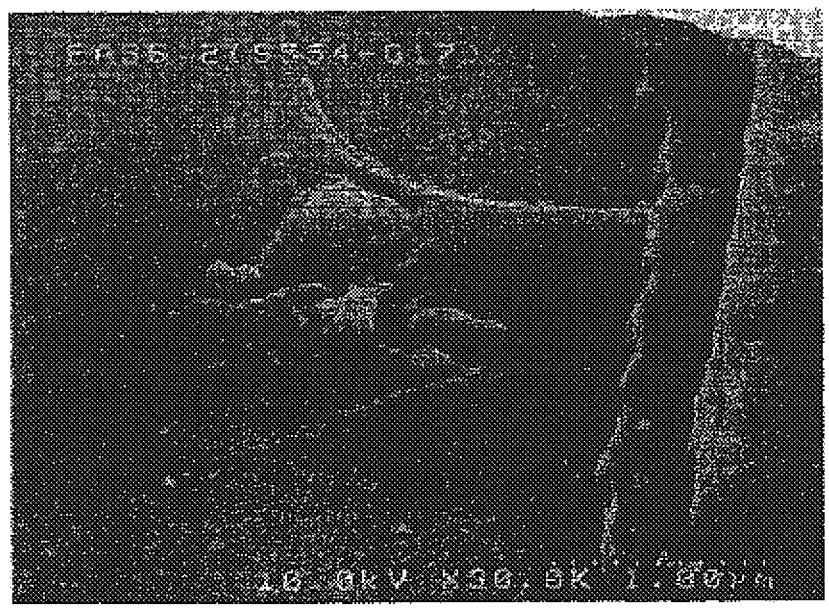

FIGS. 7A and 7B are SEM photographs showing the state in which an oxide indicated by SiOx abnormally grows. FIG. 7A is a photograph showing an active layer of a TFT magnified ten thousands times, and FIG. 7B is a photograph showing the vicinity of the oxide magnified thirty thousands times. FIG. 7B shows the state in which the active layer with formed patterns is almost divided into parts by the oxide.

The present inventors consider that such a phenomenon occurs since the active layer is in contact with the oxidizing atmosphere, and for the purpose of avoiding such a state, the present inventors adopt the structure that the thermal oxidation step is carried out after the gate insulating film is formed. That is, by making such a structure, it is possible to prevent the foregoing abnormal growth of oxide.

The present inventors consider that the abnormal growth of oxide in the state where the active layer is in contact with the oxidizing atmosphere, progresses with a rate-determining reaction between nickel silicide and oxygen. However, when a blocking layer (in this embodiment, the gate insluting film) is provided, the oxidizing rate of the active layer is determined by the rate-determining supply of oxygen through the blocking layer, and it is conceivable that, in such a case, since there is no difference in the reaction speed between silicon and nickel silicide, the abnormal growth of oxide does not occur.

The structure that the thermal oxidation is carried out after the gate insulating film is formed has also a meaning to prevent diffusion of phosphorus from a vapor phase. The phosphorus here is phosphorus added prior to the gettering step (phosphorus reaching the under film and included in the under film), and the structure prevents the phosphorus from diffusing in the atmosphere of the thermal oxidation step and being added in the active layer again (called autodoping of phosphorus as well).

Of course, in this embodiment, the thermal oxidation of the interface between the active layers 110 to 112 and the gate insulating film 113 has also the effect that the interfacial level is greatly decreased and the interfacial characteristics is remarkably improved. Moreover, it is also possible to improve the film quality of the gate insulating film 113 formed by the CVD method, and by making the active layer a thin film, it is also expected that a photoleak current is decreased. Further, defects in grains of the crystalline silicon film constituting the active layer can be decreased.

After the gate insulating film is formed and the interface of the active layer is improved in the manner described above, gate electrodes 114 to 116 made of conductive crystalline silicon films are formed. In this embodiment, the crystalline silicon film (its thickness is 200 to 300 nm) containing impurities (phosphorus) giving an N type is used.

After the gate electrodes 114 to 116 are formed, the gate insulating film 113 is etched by a dry etching method with the gate electrodes 114 to 116 as masks. In this embodiment, a $CHF_3$ gas is used to etch the silicon oxide film (FIG. 2A).

This step makes a state in which the gate insulating film remains only just under the gate electrode (and gate wiring). Of course, the portion remaining under the gate electrode functions actually as the gate insulating film.

Figure 2B:
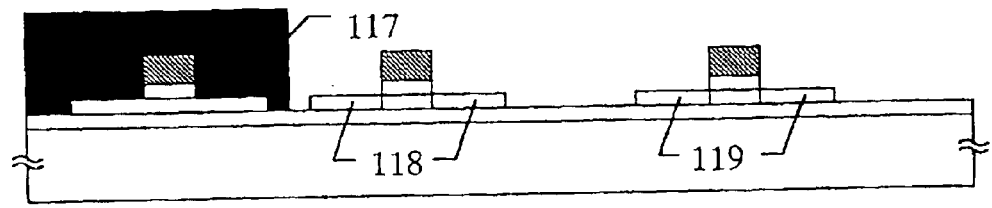

Next, a region which becomes a PTFT is concealed with a resist mask 117, and an impurity (in this embodiment, phosphorus) for giving an N type is added by an ion implantation method or a plasma doping method. Since a part of a low concentration impurity regions 118 and 119 formed at this time subsequently becomes an LDD (Lightly Doped Drain) region, the concentration of added phosphorus is $1 \times 10^{17}$ to $5 \times 10^{18}$ atoms/cm³ (FIG. 2B).

Next, after the resist mask 117 is removed, a region which becomes an NTFT is concealed with a resist mask 120, and an impurity (in this embodiment, boron) for giving a P type is added by an ion implantation method or a plasma doping method. At this time, similarly to the case of phosphorus, a low concentration impurity region 121 is formed (FIG. 2C).

Figure 2C:
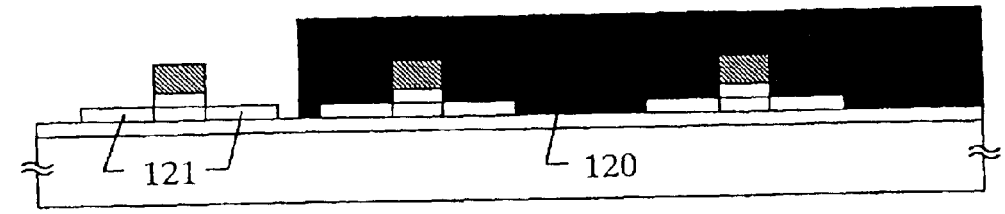
Figure 2D:
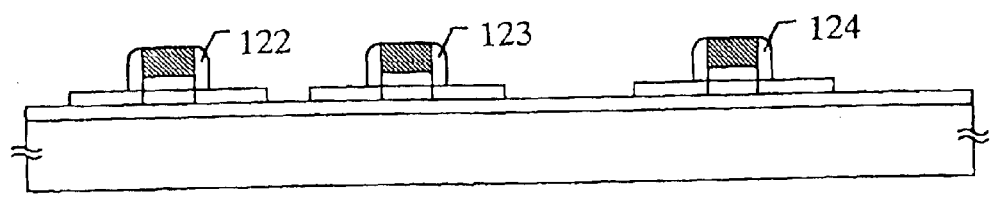

After the state of FIG. 2C is obtained in this way, the resist mask 120 is removed, and then, side walls 122 to 124 are formed by using an etch back method. In this embodiment, the side walls 122 to 124 are constituted by using silicon nitride films. A silicon oxide film, or a silicon nitride oxide film may be used other than the silicon nitride film (FIG. 2D).

The side walls 122 to 124 are formed in this way, the region which becomes the PTFT is again concealed with a resist mask 125, and phosphorus is added. At this time, the dosage is made higher than the previous adding step.

Figure 3A:
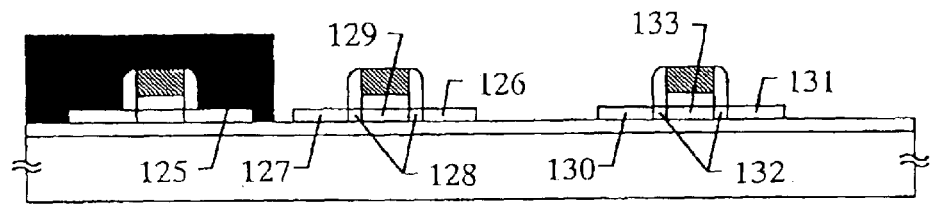
FIGS. 3A to 3C are views showing manufacturing steps of the thin film transistor of Embodiment 1.

By this adding step of phosphorus, a source region 126, a drain region 127, a low concentration impurity region (LDD region) 128, and a channel formation region 129 of the NTFT constituting a CMOS circuit are defined. Moreover, a source region 130, a drain region 131, a low concentration impurity region (LDD region) 132, and a channel formation region 133 of the NTFT constituting a pixel matrix circuit are defined (FIG. 3A).

Figure 3B:
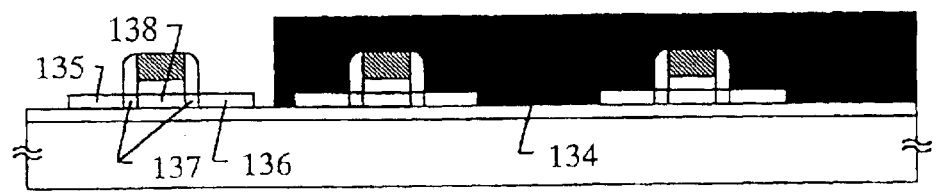

Next, after the resist mask 125 is removed, the region which becomes the NTFT is concealed with a resist mask 134, and boron with a dosage higher than the previous case is added. By this adding step of boron, a source region 135, a drain region 136, a low concentration impurity region (LDD region) 137, and a channel formation region 138 of the PTFT constituting the CMOS circuit are defined (FIG. 3B).

After the adding steps of the impurities into the active layers are ended in the manner described above, a heat treatment is carried out by furnace annealing, laser annealing, or lamp annealing to activate the added impurities. At this time, damages given to the active layers at the addition of the impurities are also repaired.

The channel formation regions 129, 133, and 138 are not added with impurities and are intrinsic or substantially intrinsic regions. Here, the phrase "substantially intrinsic" means that the concentration of impurities giving an N type or a P type is not larger than the spin density of the channel formation region, or the concentration of the impurities is within the range of $1 \times 10^{14}$ to $1 \times 10^{17}$ atoms/cm³.

Next, a first interlayer insulating film 139 of a lamination film made of a silicon nitride film with a thickness of 25 nm and a silicon oxide film with a thickness of 900 nm is formed. Then source electrodes 140 to 142 and drain electrodes 143 and 144 constituted by lamination films of Ti/Al/Ti (thicknesses are 100/500/100 nm in this order) are formed.

Next, a second interlayer insulating film of a lamination structure made of a silicon nitride film 145 with a thickness of 50 nm, a silicon oxide film (not shown) with a thickness of 20 nm, and a polyimide film 146 with a thickness of 1 $\mu$m is formed. Other than polyimide, other organic resin film of acryl, polyamide, or the like may be used. The silicon oxide film with a thickness of 20 nm functions as an etching stopper when the polyimide film 146 is dry etched.

After the second interlayer insulating film is formed, the polyimide film 146 is etched at a region where storage capacitance is subsequently formed to form an opening portion. At this time, either one of the states that only the silicon nitride film 145 remains in the bottom of the opening portion, or the silicon nitride film 145 and the silicon oxide film (not shown) remain, is set.

Then a titanium film with a thickness of 300 nm is formed and a black mask 147 is formed by patterning. This black mask 147 is disposed over portions in the pixel matrix circuit where shading is required, such as a TFT or wiring portion.

At this time, in the foregoing opening portion, such a state is obtained that the drain electrode 144 of the pixel matrix circuit and the black mask 147 are close to each other and the silicon nitride film 145 (or lamination film of the silicon nitride film and silicon oxide film) is sandwiched therebetween. In this embodiment, the black mask 147 is held at a fixed potential, and a storage capacitance 148 with the drain electrode 144 as a lower electrode and the black mask 147 as an upper electrode is formed. In this case, since the dielectric is very thin and the relative dielectric constant is high, it is possible to secure large capacitance.

After the black mask 147 and the auxiliary capacitance 148 are formed in this way, a polyimide film with a thickness of 1 $\mu$m is formed to make a third interlayer insulating film 149. Then a contact hole is formed and a pixel electrode 150 made of a transparent conductive film (typically ITO) with a thickness of 120 nm is formed.

Figure 3C:
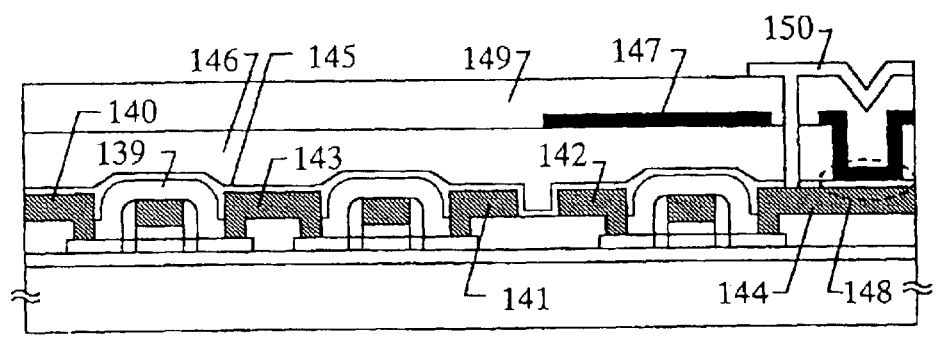

Finally, a heat treatment is carried out in a hydrogen atmosphere at about 350° C. for two hours to hydrogenate the entire of the component. In this way, the active matrix substrate as shown in FIG. 3C is completed. Subsequently, when a liquid crystal layer is held between the substrate and an opposite substrate by a well known cell assembling step, an active matrix type liquid crystal display device (transmission type) is completed.

The structure of an active matrix substrate is not limited to this embodiment, but any structure may be adopted. That is, as long as the structure satisfies the structural conditions of the present invention, a user can freely design a TFT structure, circuit arrangement, and the like.

For example, although the transparent conductive film is used as the pixel electrode, if this is replaced with a material having high reflectivity, such as a aluminum alloy film, a reflection type active matrix liquid crystal display device can be easily realized. Although the transparent substrate is required to be used as the active matrix substrate in the transmission type, the transparent substrate is not required to be used in the reflection type, and a shading substrate may be used.

[Findings as to Crystal Structure of an Active Layer]

The active layer formed in accordance with the foregoing manufacturing steps has microscopically a crystal structure in which a plurality of rod-like or flattened rod-like crystals are arranged almost parallel to each other and with regularity to a specific direction. This can be easily ascertained by observation with a TEM (Transmission Electron Microscope).

Figure 9A:
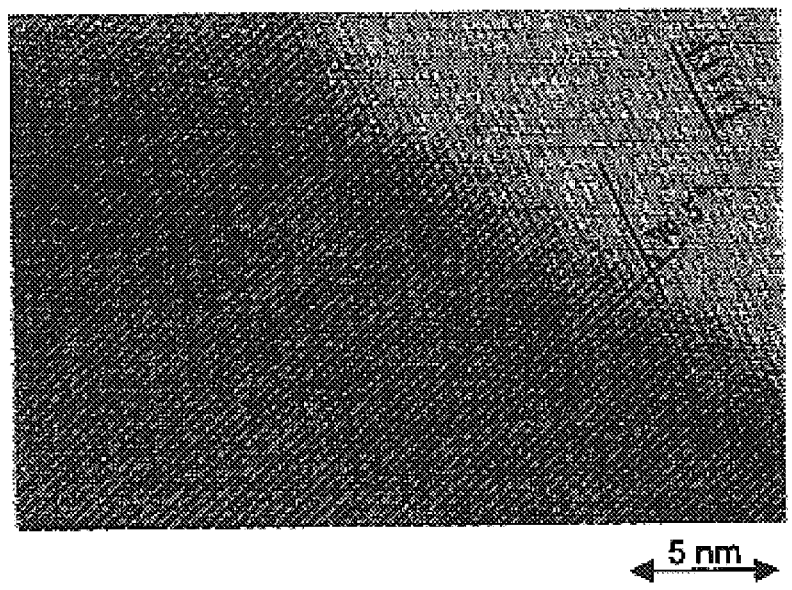
FIGS. 9A and 9B are TEM photographs showing the structure of crystal grain boundaries of semiconductor thin films.

FIG. 9A is a HR-TEM photograph showing a crystal grain boundary of rod-like or flattened rod-like crystals, magnified eight million times. In the present specification, the term "crystal grain boundary" is defined as a grain boundary formed at an interface where rod-like or flattened rod-like crystals are in contact with each other. Thus, the crystal grain boundary is regarded as different from, for example, a macroscopic grain boundary formed by collision of separate lateral growth regions.

Incidentally, the foregoing HR-TEM (High Resolution Transmission Electron Microscope) is a method in which a sample is vertically irradiated with an electron beam, and the arrangement of atoms and molecules is estimated by using interference of transmitted electrons or elastically scattered electrons.

In the HR-TEM, it is possible to observe the state of arrangement of crystal lattices as lattice stripes. Thus, by observing the crystal grain boundary, it is possible to guess the bonding state of atoms at the crystal grain boundary. Incidentally, although lattice stripes appear as stripe patterns of black and white, they show the difference in contrast, and do not show the positions of atoms.

FIG. 9A is a typical TEM photograph of a crystalline silicon film (lateral growth region) obtained by the present invention, and two different crystal grains are in contact with each other to form the crystal grain boundary. At this time, the two crystal grains were almost in {110} orientation although some deviations were included in crystal axes.

Although described later, as the result of investigation of a plurality of crystal grains, it is ascertained by X-ray diffraction or electron beam diffraction that almost all crystal grains are substantially in the {110} orientation. Although many observed crystal grains ought to include a (001) plane, a (200) plane and the like, those equivalent planes will be expressed together by a {110} plane.

As shown in FIG. 9A, lattice stripes corresponding to the {111} plane are observed in the face. Incidentally, the lattice stripe corresponding to the {111} plane indicates such a lattice stripe that when a crystal grain is cut along the lattice stripe, the {111} plane appears in the section. In a simplified manner, it is possible to confirm, by the distance between the lattice stripes, to what plane the lattice stripe corresponds.

The reason why there is a difference in the appearance of the lattice stripes in FIG. 9A is that the slopes of the crystal grains are subtly different from each other. That is, when it is designed so that the crystal face of one of crystal grains is vertically irradiated with an electron beam, the other crystal grain is just obliquely irradiated with the electron beam. Thus, the appearance of the lattice stripe is changed.

Here, attention will be paid to the lattice stripe corresponding to the {111} plane. In FIG. 9A, the lattice stripe corresponding to the {111} plane of the crystal grain (upper side) looking white intersects the lattice stripe corresponding to the {111} plane of the crystal grain (lower side) looking black at an angle of about 70°.

Such crystal structure (precisely, structure of crystal grain boundary) shows that two different crystal grains are in contact with each other with extremely excellent conformity. That is, the crystal lattices are continuous at the crystal grain boundary so that they make such a structure that it is very hard to produce trap levels. In other words, it can be said that the crystal lattices have continuity at the crystal grain boundary.

Figure 9B:
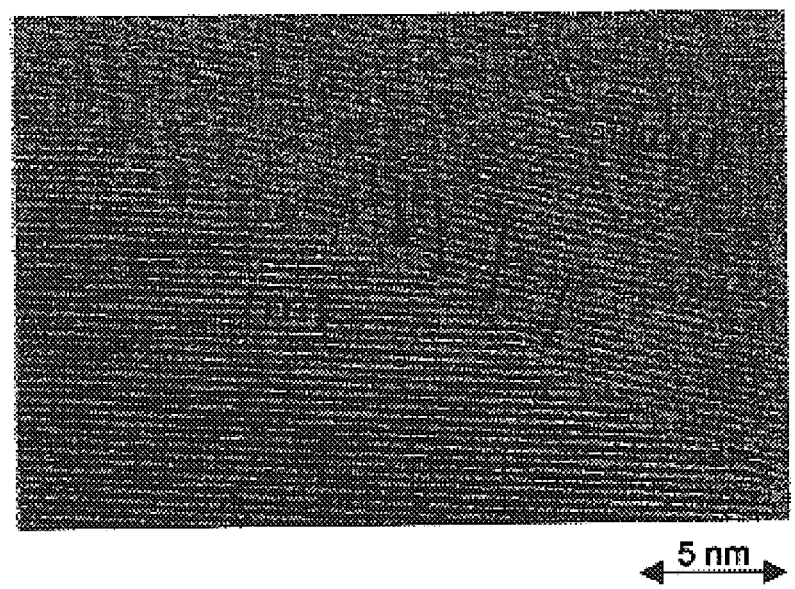

For reference, FIG. 9B shows an HR-TEM photograph of a conventional high temperature polysilicon film. In the case of FIG. 9B, although described later, there was no regularity in the crystal face, and the orientation was not such that the {110} plane became main. However, for comparison to FIG. 9A, observation was made here to such crystal grains that the lattice stripe corresponding to the {111} plane appeared.

When FIG. 9B is observed in detail, as shown by arrows in the drawing, many portions where the lattice stripes are disconnected can be confirmed at the crystal grain boundary. In such portions, there are uncombined bonds (which can be called crystal defects), and there is a high possibility that as trap levels, they block the movement of carriers.

However, it is certain that the crystalline silicon film of the present invention also includes uncombined bonds as shown in FIG. 9B. This is inevitable as long as the crystalline silicon film of the present invention is polycrystal. However, as the result of TEM observation in detail for the crystalline silicon film of the present invention over a wide range, it has been found that such uncombined bonds are very few.

As long as the present applicant investigated, crystal grain boundaries of 90% or more of the whole (typically 95% or more) were seen to have continuity of crystal lattices, and uncombined bonds as shown in FIG. 9B could be hardly found. Also from this observation, it can be said that the crystal silicon film of the present invention is clearly different from conventional high temperature polysilicon.

Figure 10A:
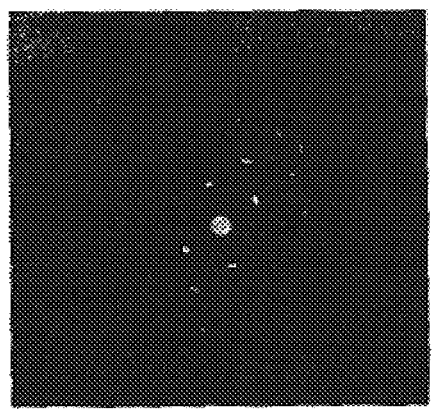
FIGS. 10A and 10B are photographs showing electron beam diffraction patterns of semiconductor thin films.

Next, FIG. 10A shows the result of investigation of the crystalline silicon film of the present invention by electron beam diffraction. Here, FIG. 10A shows the typical electron beam diffraction pattern of the crystalline silicon film of the present invention. For reference, FIG. 10B shows a typical electron beam diffraction pattern of a conventional high temperature polysilicon film.

Figure 10B:

In FIGS. 10A and 10B, since measurement is made while the diameter of an irradiation spot of an electron beam is made 1.5 $\mu$m, it may be considered that information of a sufficiently macro region as compared with a lattice stripe level is gathered.

In the case of FIG. 10A, diffraction spots corresponding to <110> incidence appear comparatively clearly, and it can be ascertained that a crystal axis is a <111> axis (crystal plane is a {110} plane).

The respective spots have small concentric expanses, and it is inferred that this is caused because a distribution of some degree of rotation angles exists around the crystal axis. The degree of the expanses is within 5° from estimation of the pattern.

On the other hand, in the case of the electron beam diffraction pattern shown in FIG. 10B, the diffraction spots do not have definite regularity, and it can be ascertained that the spots are oriented almost at random. That is, it is inferred that crystals with plane orientations other than the {110} plane are irregularly mixed.

As shown from these results, in the crystalline silicon film of the present invention, almost all crystal grains are oriented roughly in the {110} plane. As long as the crystal grains of 70% or more of the whole (preferably 90% or more) are not oriented in the {110} plane, the electron beam diffraction pattern as shown in FIG. 10A can not be obtained.

Incidentally, the present inventors performed X-ray diffraction in accordance with a method disclosed in Japanese Patent Laid-Open 7-321339, and calculated the ratio of orientation with respect to the crystalline silicon film of the present invention. In the publication, the ratio of orientation is defined with the calculation method as indicated by the following expression 1:

{220} orientation existence ratio=1 (constant),

{111} orientation existence ratio=(relative strength of {111} to {220} of a sample)/(relative strength of {111} to {220} of powder), {311} orientation existence ratio=(relative strength of {311} to {220} of a sample)/(relative strength of {311} to {220} of powder), and {220} orientation ratio=({220} orientation existence ratio)/({220} orientation existence ratio+{111} orientation existence ratio+{311} orientation existence ratio).

As the result of the X-ray diffraction, the peak corresponding to a {220} plane (equivalent to the {110} plane) appeared most intensely, and it was found that the {110} plane was the main oriented plane, and the orientation ratio was 0.7 or more (typically 0.9 ore more).

As has been described above, it is understood that the crystalline silicon film of the present invention has a crystal structure (crystal constitution) quite different from a conventional polysilicon film. From this point as well, it can be said that the crystalline silicon film of the present invention is a quite novel semiconductor film.

The present applicant refers to the crystalline silicon film of the present invention having the above described crystal structure and features as a continuous grain boundary crystalline silicon (Continuous Grain Silicon: CGS).

Incidentally, it is very effective in decreasing defects within a crystal grain to carry out the annealing step (step shown in FIG. 1E) at a temperature above the crystallizing temperature when the semiconductor thin film of the present invention is formed as in the embodiment 1. This will be described below.

Figure 11A:
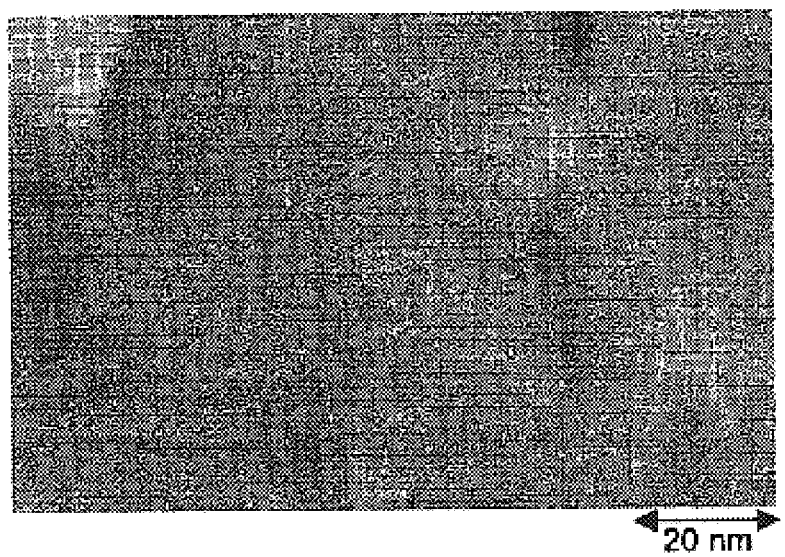
FIGS. 11A and 11B are TEM photographs showing crystal grains of semiconductor thin films of Embodiment 1.

FIG. 11A is a TEM photograph showing a crystalline silicon film manufactured in accordance with the embodiment 1, magnified one million times. Defects due to lamination defects or dislocations are hardly seen in the crystal grain, and it is understood that the crystallinity is very high. This tendency can be seen in the entire of the film surface, and although it is difficult to reduce the number of defects to zero in the present circumstances, it is possible to reduce the number to substantially zero.

That is, in the crystalline silicon film shown in FIG. 11A, the defects in the crystal grain are reduced to the degree that the defects can be almost neglected, and the crystal grain boundary can not become a barrier against movement of carriers due to the high continuity, so that the film can be regarded as single crystal or substantially single crystal.

Figure 11B:
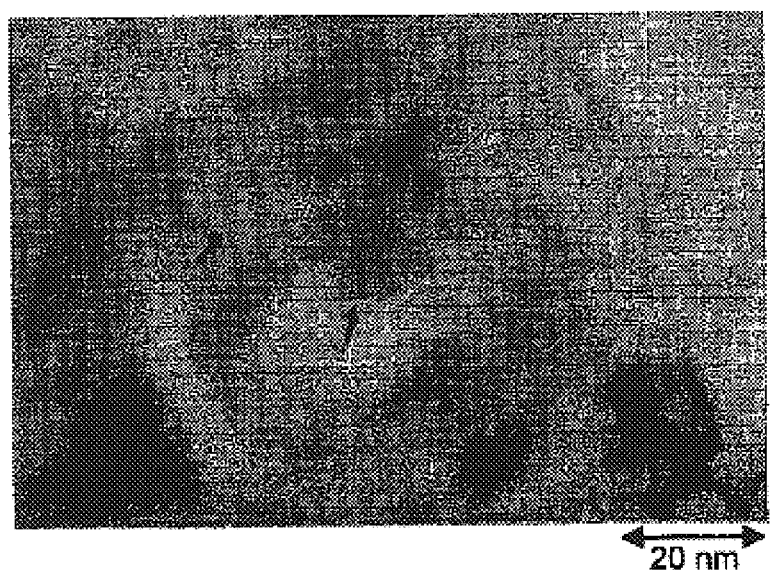

On the other hand, FIG. 11B is a TEM photograph showing a crystalline silicon film at a time when steps up to the gettering step shown in FIG. 1C have been ended, which is magnified one million times. In the crystal grain (black portion and white portion appear due to difference in contrast), many defects as indicted by arrows can be recognized. Although such defects are mainly lamination defects in which the order of lamination of atoms on a silicon crystal lattice plane is discrepant, there is also a case of dislocation or the like.

Like this, in the crystalline silicon films shown in the photographs of FIGS. 11A and 11B, although the crystal grain boundaries have almost equal continuity, there is a large difference in the number of defects in the crystal grains. The reason why the crystalline silicon film of the present invention shows electrical characteristics much higher than the crystalline silicon film shown in FIG. 11B is mainly the difference in the number of defects.

This phenomenon is considered such that surplus silicon atoms produced when the crystalline silicon film is thermally oxidized, move to the defects and greatly contribute to formation of Si—Si bonds. This concept is known as a reason why few defects exist in the crystal grain of a high temperature polysilicon film.

The present applicant considers such a model as well that the crystalline silicon film is bonded to its under film by a heat treatment at a temperature (700 to 1100° C.) above the crystallizing temperature and the adhesiveness is increased, so that the defects disappear.

There is a difference of nearly 10 times in the coefficient of thermal expansion between the crystalline silicon film and the silicon oxide film as the under film. Thus, in the state in which the amorphous silicon film is transformed into the crystalline silicon film, a very large stress is applied to the crystalline silicon film when the crystalline silicon film is cooled.

Figure 12A:
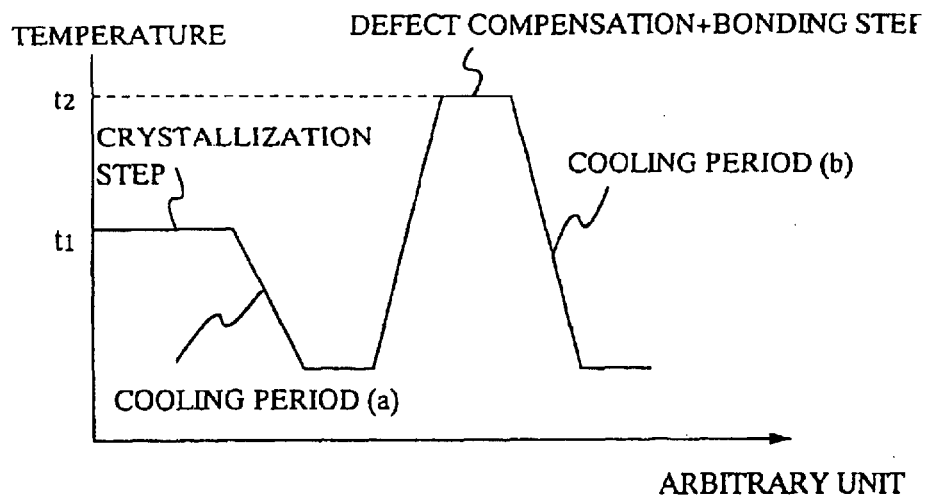
FIGS. 12A to 12C are views for explaining a model with respect to generation and extinction of defects of Embodiment 1.

This will be described with reference to FIGS. 12A to 12C. FIG. 12A shows heat hysteresis applied to the crystalline silicon film after the crystallizing step. First, the crystalline silicon film crystallized at a temperature ($t_1$) is cooled to a room temperature through a cooling period (a).

Figure 12B:
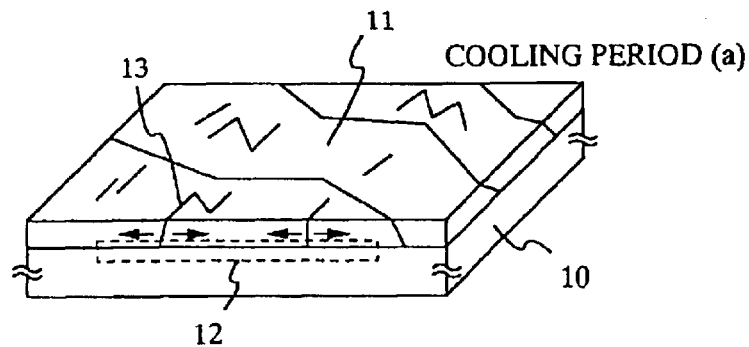
Figure 12C:
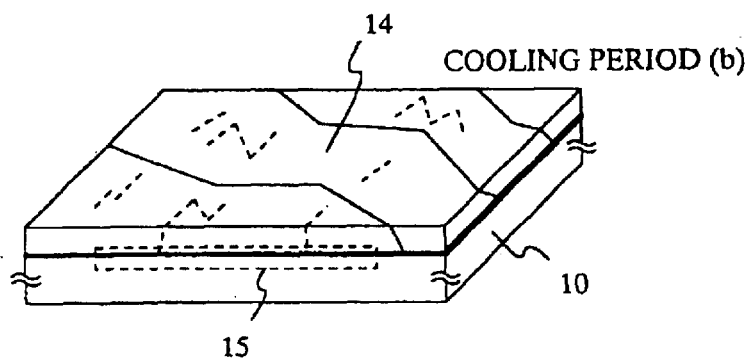

FIG. 12B shows the crystalline silicon film during the cooling period (a), and reference numeral 10 denotes a substrate, and 11 denotes a crystalline silicon film. At this time, adhesiveness at an interface 12 between the crystalline silicon film 11 and the substrate 10 is not very high, and it is conceivable that this generates many defects in grains.

That is, it is conceivable that the crystalline silicon film 11 pulled due to the difference in the coefficient of thermal expansion is very easily moved on the substrate 10, so that defects 13 such as lamination defects and dislocations are easily generated by force such as tensile stress.

The thus obtained crystalline silicon film is in the state as shown in FIG. 11B. This state remains as it is even after the gettering step (600 to 650° C.) by phosphorus is carried out.

Thereafter, as shown in FIG. 12A, a thermal oxidation step is carried out at a temperature ($t_2$), and as the result, the defects in the crystalline silicon film disappear because of the above-described reason.

The important point here is that the crystalline silicon film is bonded to the substrate at the same time as the compensation for defects by the surplus silicon atoms at the thermal oxidation step, so that the adhesiveness to the substrate is raised. That is, it is conceivable that this thermal oxidation step serves also as a bonding step of the crystalline silicon film and the substrate as an under film.

After the defect compensation+bonding step is ended in this way, the film is cooled to a room temperature through a cooling period (b). Here, the point different from the cooling period (a) is that an interface 15 between the substrate 10 and a crystalline silicon film 14 after annealing is in a state having very high adhesiveness (FIG. 12C).

When the adhesiveness is high like this, since the crystalline silicon film 14 is completely bonded to the substrate 10, even if stress is applied to the crystalline silicon film at the cooling stage of the crystalline silicon film, defects are not generated. That is, it is possible to prevent defects from being generated again.

Incidentally, in FIG. 12A, although the process in which the temperature is lowered to a room temperature after the crystallizing step, is shown as an example, it is also possible to carry out the defect compensation+bonding step by directly raising the temperature after the end of crystallization. Even if such a process is carried out, the crystalline silicon film of the present invention can be obtained.

The thus obtained crystalline silicon film (FIG. 11A) has a feature that the number of defects in the crystal grain is much smaller than the crystalline silicon film (FIG. 11B) in which a heat treatment at a temperature above that required in the crystallizing step has not been carried out.

The difference in the number of defects appears as the difference in spin density by an electron spin resonance analysis (Electron Spin Resonance: ESR). In the present circumstances, it has been ascertained that the spin density of the crystalline silicon film manufactured in accordance with the manufacturing steps of the embodiment 1 is at most $5 \times 10^{17}$ spins/cm$^3$ (preferably $3 \times 10^{17}$ spins/cm$^3$ or less). However, since this measurement value is near the detection limit of an existing measuring device, it is expected that the actual spin density is lower than this value.

[Findings as to Electrical Characteristics of a TFT]

The TFT manufactured in this embodiment shows electrical characteristics comparable to a MOSFET using single crystal silicon. Data as set forth below are obtained from TFTs experimentally formed by the present inventors.

(1) The subthreshold coefficient as an index showing switching performance (promptness in switching of on/off operation) of a TFT is as small as 60 to 100 mV/decade (typically 60 to 85 mV/decade) for both an N-channel TFT and a P-channel TFF.

(2) The field effect mobility ($\mu_{FE}$) as an index showing an operation speed of a TFT is as large as 100 to 250 cm$^2$/Vs (typically 120 to 200 cm$^2$/Vs) for an N-channel TFT, and 80 to 200 cm$^2$/Vs (typically 100 to 150 cm$^2$/Vs) for a P-channel TFT.

(3) The threshold voltage ($V_{th}$) as an index indicating a driving voltage of a TFT is as small as −0.5 to 1.5 V for an N-channel TFT and −1.5 to 0.5 V for a P-channel TFT.

As described above, it is ascertained that extremely superior switching characteristics and high speed operation characteristics can be realized.

[Findings as to Circuit Characteristics]

Next, frequency characteristics of a ring oscillator fabricated by employing TFTs, which are formed by using semiconductor thin films of the present invention, will be described. The ring oscillator is a circuit in which an odd number of stages of inverter circuits made of a CMOS structure are connected like a ring, and is used for obtaining a delay time per stage of the inverter circuit. The structure of the ring oscillator used for the experiment is as follows:

number of stages: nine,
thickness of gate insulating film of TFT: 30 nm and 50 nm, and
gate length of TFT: 0.6 µm.

As the result of investigation of oscillation frequencies by this ring oscillator, it was possible to obtain a maximum oscillation frequency of 1.04 GHz. A shift register as one of TEGs of LSI circuits was actually fabricated and its operation frequency was ascertained. As a result, an output pulse of an operation frequency 100 MHz was obtained in a shift register circuit in which the thickness of a gate insulating film was 30 nm, the gate length was 0.6 µm, the power source voltage was 5 V, and the number of stages was 50.

The above described surprising data of the ring oscillator and the shift register show that the TFT of the present invention has performance comparable to or exceeding an IGFET using single crystal silicon.

[Findings as to Relation Between TFT Characteristics and CGS]

The above described excellent TFT characteristics and circuit characteristics depend on mainly the use of the semiconductor thin film, having continuity of crystal lattices at the crystal grain boundary, as the active layer of the TFT. The reason will be considered below.

The continuity of crystal lattices at the crystal grain boundary is caused from the fact that the crystal grain boundary is a grain boundary called "planar boundary". The definition of the planar boundary in the present specification is given as "Planar boundary" set forth in "Characterization of High-Efficiency Cast-Si Solar Cell Wafers by MBIC Measurement, Ryuichi Shimokawa and Yutaka Hayashi, Japanese Journal of Applied Physics vol. 27, No. 5, pp. 751–758, 1988".

According to the above paper, the planar boundary includes a {111} twin boundary, {111} stacking fault, {221} twin boundary, {221} twist boundary, and the like. This planar boundary has a feature that it is electrically inactive. That is, since the boundary does not function as a trap for blocking the movement of carriers though it is a crystal grain boundary, the boundary can be regarded as substantially not existing.

Especially, the {111} twin boundary is also called a corresponding boundary of Σ3, and the {221} twin boundary is also called a corresponding boundary of Σ9. The Σ value is a parameter which becomes an index showing the degree of conformity of a corresponding boundary. It is known that as the Σ value is small, the conformity of the boundary is superior.

As the result of detailed observation for a semiconductor thin film of the present invention conducted by the present applicant, it was found that almost all crystal grain boundaries (90% or more, typically 95% or more) are the corresponding boundaries of Σ3, that is, the {111} twin boundaries.

In the crystal grain boundary formed between two crystal grains, when the plane orientations of both crystals are {110}, and if an angle formed by lattice stripes corresponding to the {111} plane is θ, it is known that when θ is 70.5°, the boundary becomes the corresponding boundary of Σ3.

Thus, in the crystal grain boundary shown in the TEM photograph of FIG. 9A, the respective lattice stripes of adjacent crystal grains are continuous at an angle of 70°, so that it can be easily presumed that this crystal grain boundary is the {111} twin boundary.

Incidentally, when θ is 38.9°, the boundary becomes the corresponding boundary of Σ9. Such other crystal grain boundary also existed.

Such a corresponding boundary is formed only between crystal grains of the same plane orientation. That is, since the plane orientation of the semiconductor thin film of the present invention is uniform roughly as {110}, such a corresponding boundary can be formed over a wide range. This feature can not be obtained by other polysilicon films in which the plane orientation is irregular.

Figure 13A:
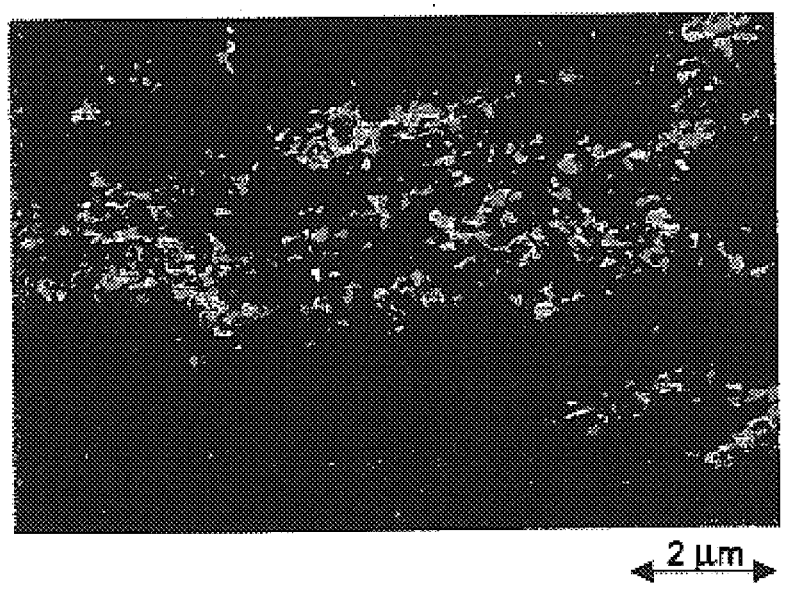
FIGS. 13A and 13B are TEM photographs showing dark field images of semiconductor thin films.

FIG. 13A is a TEM photograph (dark field image) of a semiconductor thin film of the present invention, which is magnified 15 thousands times. Although white regions and black regions are seen in the photograph, portions of the same color have the same orientation.

The highly remarkable feature in FIG. 13A is that in the dark field image of such a wide range, the white regions are continuously united at a rather high rate. This means that crystal grains having the same orientation exist with some directionality, and adjacent crystal grains have almost the same orientation.

Figure 13B:
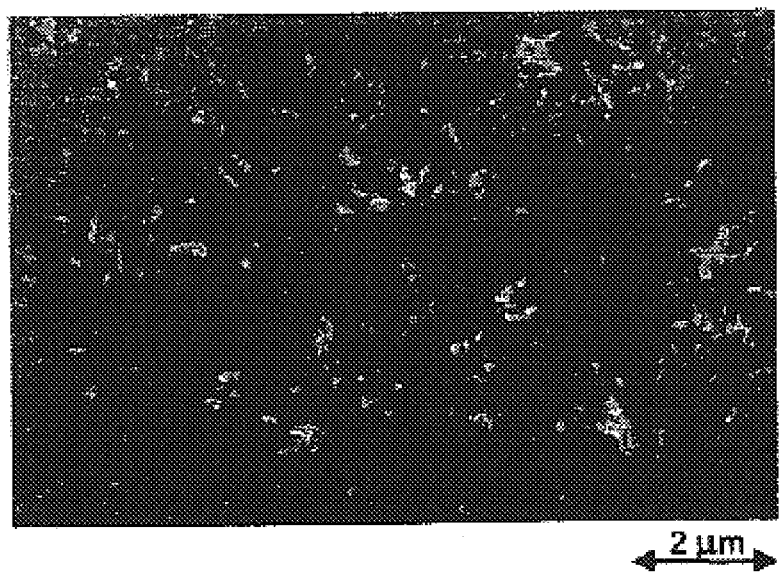

On the other hand, FIG. 13B is a TEM photograph (dark field image) in which a conventional high temperature polysilicon film is magnified 15 thousands times. In the conventional high temperature polysilicon film, portions of the same plane orientation merely exist at random, and the uniformity with directionality as shown in FIG. 13A can not be ascertained. It is conceivable that this is caused from complete irregularity of orientation of adjacent crystal grains.

Figure 14:
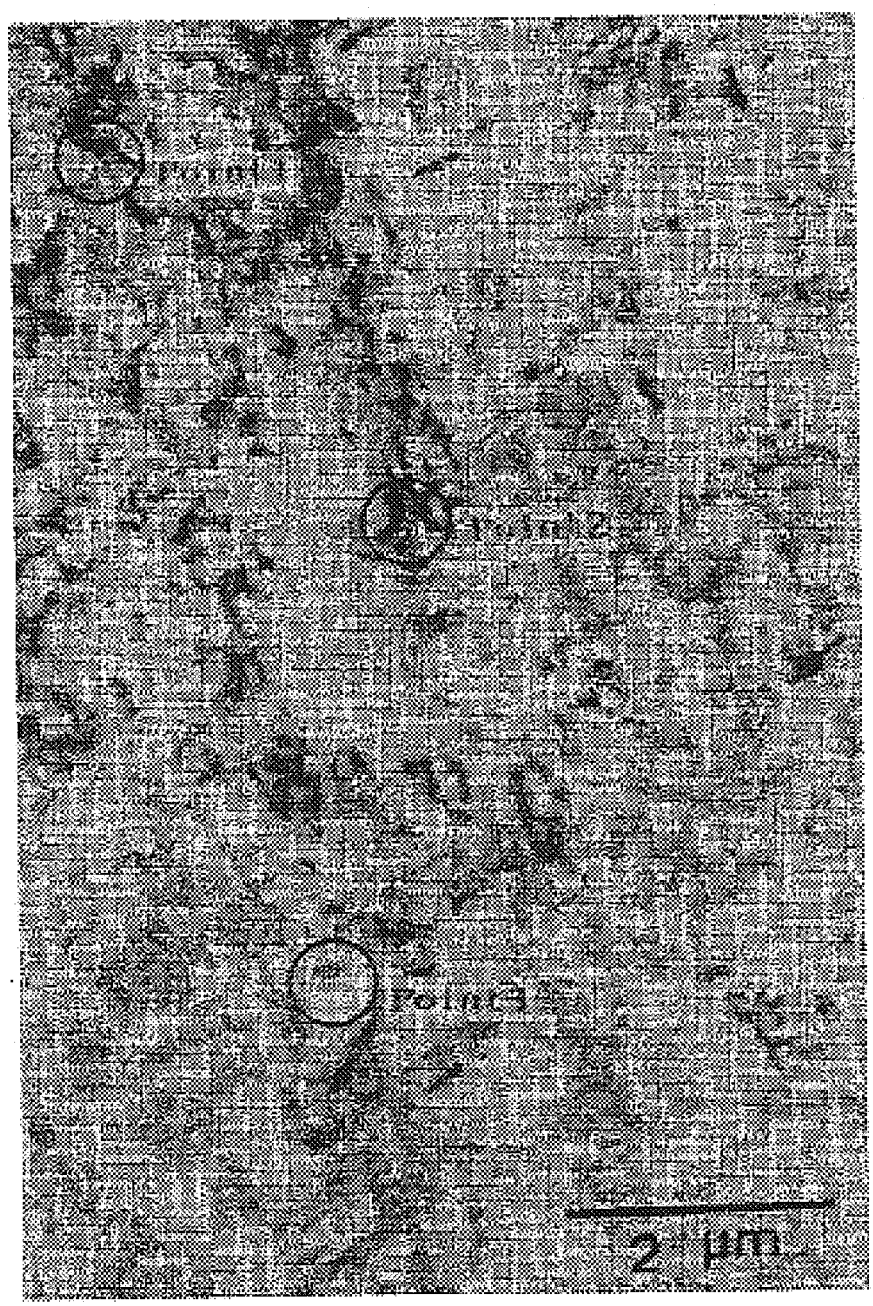
FIG. 14 is a TEM photograph showing a bright field image of a semiconductor thin film of Embodiment 1.
Figure 15A:
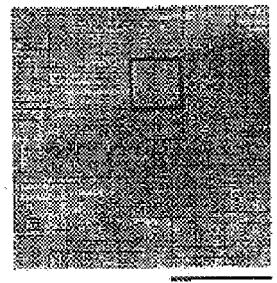
FIGS. 15A to 15C are TEM photographs showing the state of a crystal grain boundary of the semiconductor thin film of Embodiment 1.
Figure 15B:
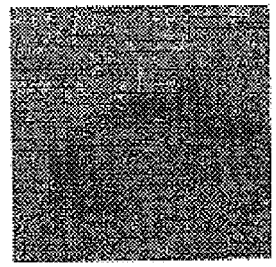
Figure 15C:
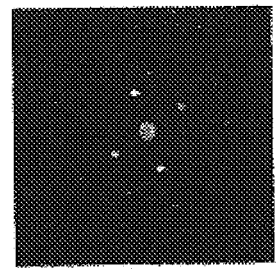

FIG. 14 is a TEM photograph showing the same place as FIG. 13 in a light field. FIG. 15A is a photograph showing Point 1 in FIG. 14, which is magnified 300 thousands times, and FIG. 15B is a photograph showing Point 1 in FIG. 14, which is magnified two millions times. The region surrounded by a square in FIG. 15A corresponds to FIG. 15B. FIG. 15C shows an electron beam diffraction pattern (spot diameter is 1.7 $\mu m\phi$) in Point 1.

Figure 16A:
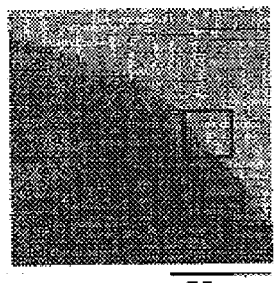
FIGS. 16A to 16C are TEM photographs showing the state of a crystal grain boundary of the semiconductor thin film of Embodiment 1.
Figure 16B:
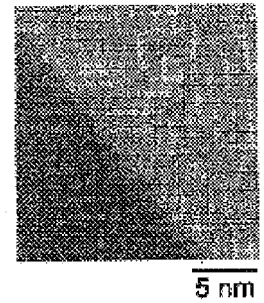
Figure 16C:
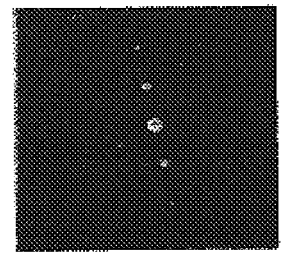
Figure 17A:
FIGS. 17A to 17C are TEM photographs showing the state of a crystal grain boundary of the semiconductor thin film of Embodiment 1.
Figure 17B:
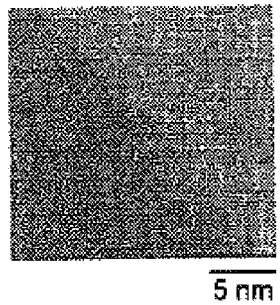
Figure 17C:
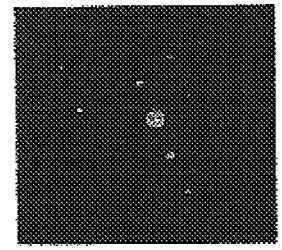

Point 2 and Point 3 were observed under the same condition as Point 1. FIGS. 16A, 16B and 16C show the results of observation of Point 2, and FIGS. 17A, 17B and 17C show the results of observation of Point 3.

From these results of observation, it is understood that the continuity of crystal lattices is maintained at any crystal grain boundary, and the planar boundary is formed. Incidentally, the present applicant repeated observations and measurements over a number of regions other than the measurement points shown here, and ascertains that the continuity of crystal lattices at the crystal grain boundary is maintained in a sufficiently wide region for manufacturing a TFT.

[Embodiment 2]

In this embodiment, an example in which a crystallizing step of an amorphous silicon film is carried out by a means different from the embodiment 1 will be described with reference to FIGS. 8A to 8E. Concretely, the example in which there is employed the means as disclosed in embodiment 1 of Japanese Patent Laid-open No. 7-130652 will be described.

Figure 8A:
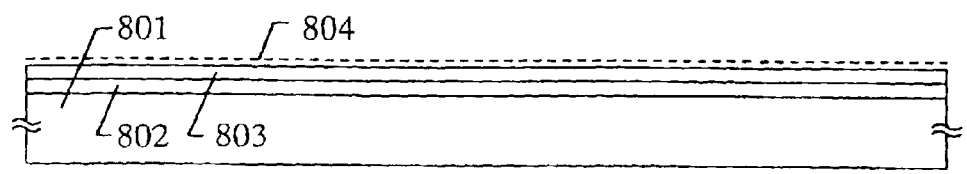
FIGS. 8A to 8E are views showing manufacturing steps of a thin film transistor of Embodiment 2.

First, a silicon oxide film with a thickness of 200 nm is formed on a quartz substrate 801. Then an amorphous silicon film 803 with a thickness of 75 nm is formed thereon by a low pressure CVD method. A nickel acetate solution containing nickel of 10 ppm in weight is applied by a spin coating method to form a nickel containing layer 804 (FIG. 8A).

Figure 8B:
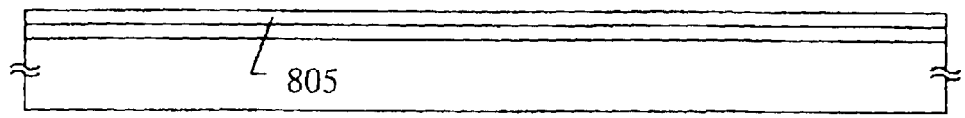
Figure 8C:
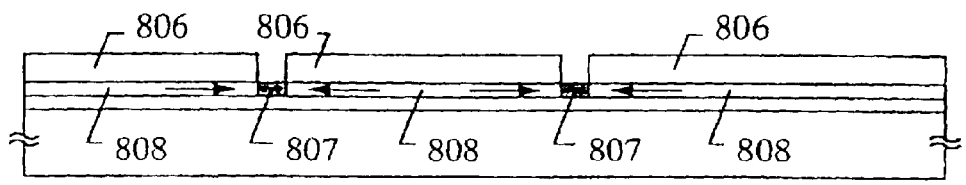
Figure 8D:
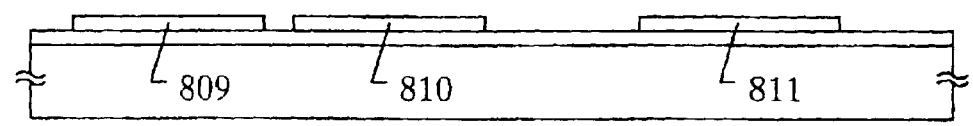

Next, after dehydrogenating is carried out at 500° C. for one hour, a heat treatment is carried out at 550° C. for 4 hours to form a crystalline silicon film 805. At this time, excimer laser annealing may be carried out after crystallization to crystalize remaining amorphous components and to lower defects in grains (FIG. 8B).

After the crystalline silicon film 805 is obtained in this way, an insulating film 806 for carrying out a gettering step with phosphorus is formed. In this embodiment, a silicon oxide film having a thickness of 150 nm and made by a plasma CVD method is used as the insulating film 806.

This insulating film (silicon oxide film) 806 is provided with a plurality of opening portions, and phosphorus is added in this state to form phosphorus added regions 807. In this embodiment, although the phosphorus added regions 807 are formed by the plasma doping method, other means as shown in the embodiment 1 may be used.

After the phosphorus added regions 807 are formed, a heat treatment is carried out at 600° C. for 12 hours to move (getter) nickel in the film into the phosphorus added regions 807. The detail of this gettering step may follow the embodiment 1. In this way, crystalline silicon films 808 in which the concentration of nickel is lowered at least lower than $2\times10^{17}$ atoms/cm$^3$ is obtained.

Figure 8E:
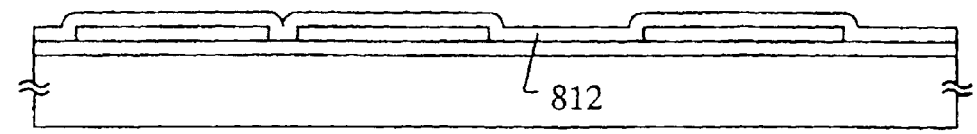

The steps up to the gettering step are completed in the manner described above, active layers 809 to 811 are formed by using only the crystalline silicon films in which nickel is gettered, and after they are covered with a gate insulating film 812, a thermal oxidation step is carried out (FIG. 8E).

The reason why the thermal oxidation step is carried out after the active layers 809 to 811 are covered with the gate insulating film 812 is as explained in the embodiment 1. The detailed conditions of the thermal oxidation step may also be referred to the embodiment 1.

As described above, the present invention can be applied to the case of carrying out such a crystallizing step that a catalytic element is added to the entire surface of an amorphous semiconductor film.

[Embodiment 3]

Figure 4:
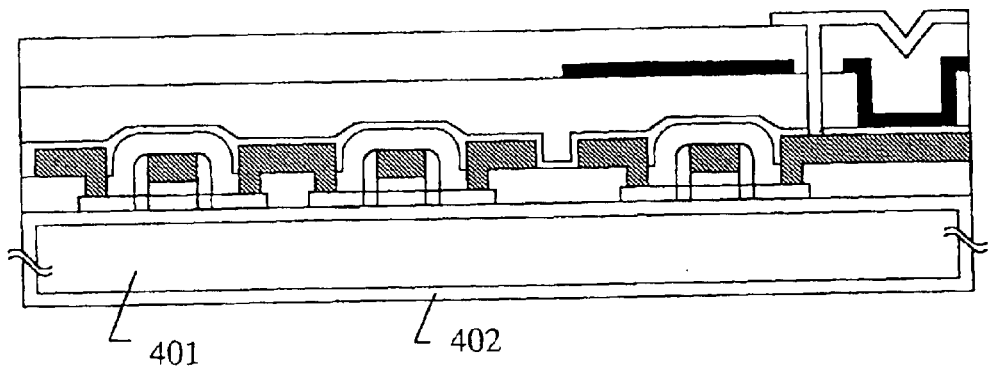
FIG. 4 is a view showing a structure of a thin film transistor of Embodiment 3.

In this embodiment, an example in which crystallized glass is used for the substrate in the embodiment 1, and an insulating silicon film formed by a low pressure CVD method is used as a protective film (serving also as an under film) for protecting the glass substrate, will be described with reference to FIG. 4.

In the case of this embodiment, crystallized glass containing ingredients of SiO$_2$: 52.5, Al$_2$O$_3$:26.5, MgO:11.9, and TiO$_2$:11.4 is prepared as a substrate 401. This is non-alkaline cordierite crystallized glass using TiO$_2$ as a nucleus forming agent.

Next, an insulating silicon film 402 capable of functioning as a protective film is formed on the front surface, rear surface, and side surface of the crystallized glass. In this embodiment, a silicon nitride oxide film is formed by a low pressure CVD method using silane (SiH$_4$) and nitrous oxide (N$_2$O) as a film forming gas.

In this case, the film forming temperature is made 800 to 850° C. (in this embodiment, 850° C.), and the flow of each of the film forming gases is made SiH$_4$:10 to 30 sccm and N$_2$O:300 to 900 sccm. Further, it is appropriate to make the reaction pressure 0.5 to 1.0 torr.

When silane and nitrogen dioxide (NO$_2$) or nitric oxide (NO) are used as film forming gases, it is also possible to form a silicon nitride oxide film at a temperature of 600 to 650° C. In this case, it is appropriate that the reaction pressure is made 0.1 to 1.0 torr, and the flow of each gas is made SiH$_4$:10 to 30 sccm and NO$_2$ or NO:300 to 900 sccm.

In this case, since the silicon nitride oxide film is formed by the low pressure CVD method, the entire surface of the crystallized glass is covered with the insulating film.

When the film forming gas is made different, a silicon nitride film can also be formed as a protective film for the crystallized glass. In this case, it is appropriate that dichlorsilane ($SiH_2Cl_2$) of 40 to 50 sccm and ammonia ($NH_3$) of 200 to 250 sccm are used as film forming gases, the film forming temperature is made 750 to 800° C., and the reaction pressure is made 0.1 to 0.5 torr.

Although the silicon nitride film is an optimum insulating film for blocking the outflow of glass components, since its stress is strong, the film was unsuitable for an under film of a TFT. However, in the present invention, since the silicon nitride film is formed at least the front surface and the back surface of the crystallized glass, the stress of the silicon nitride film at the back of the substrate cancels the stress at the front, so that warps or the like of the substrate do not occur.

According to the structure of this embodiment, when the active matrix substrate shown in the embodiment 1 is manufactured, the inexpensive glass substrate is used, so that the cost of an electro-optical device can be greatly reduced. Moreover, since the substrate can be made large according to the feature of the glass substrate, it becomes possible to manufacture an active matrix substrate corresponding to a large screen of several tens inches diagonal.

[Embodiment 4]

In the embodiment 1, although the crystalline silicon film exhibiting the N type conductivity is used as the gate electrode, any material may be used as long as the material has conductivity. Especially, in the case where a liquid crystal display device for direct view is manufactured, since the area of a pixel matrix circuit is increased, it is preferable to use a material having low wiring resistance.

In such a case, it is desirable to use aluminum or a material containing aluminum as the main ingredient for the gate electrode. In this embodiment, an aluminum film containing scandium of 2 wt % is used for the gate electrode.

In the case where the material containing aluminum as the main ingredient is used for the gate electrode, it is suitable to use a technique disclosed in Japanese Patent Laid-Open No. 7-135318 by the present inventors et al. In the publication, instead of the side wall used in the embodiment 1, an anodic oxidation film obtained by anodic oxidation of the gate electrode is used.

As in this embodiment, when aluminum or material containing aluminum as the main ingredient is used for the gate electrode, it becomes possible to form the gate wiring with low wiring resistance, and to manufacture an active matrix substrate with a high response speed.

This embodiment may be combined with the embodiment 2 or 3.

[Embodiment 5]

In the embodiment 1, it is effective to add an impurity for controlling a threshold voltage (Vth) of a TFT into an active layer. Although it is possible to add the impurity at the film formation of an amorphous silicon film, since it is sufficient if the impurity is added at least in a channel formation region, the impurity may be added at any time before formation of a gate electrode.

In the case where the impurity is added at a time other than the film formation, a means such as addition by an ion implantation method or a plasma doping method, addition by diffusion from a vapor phase, addition by diffusion from a solid phase, and the like may be used. These means are effective since selective addition is possible, for example, added impurities are made different between an NTFT and a PTFT.

As the added impurity element, when the threshold voltage Vth is shifted to a plus side, an element in group 13 (boron, gallium, or indium) is used, and when the threshold Vth is shifted to the minus side, an element in group 15 (phosphorus, arsenic or antimony) is used.

This embodiment may be combined with the structure of the embodiments 1 to 3.

[Embodiment 6]

In the embodiment 1 or 2, although the thermal oxidation step is carried out after the surface of the active layer is covered with the gate insulating film, the insulating film covering the surface of the active layer is not necessarily required to function as the gate insulating film.

In this case, the surface of the active layer is covered with an insulating film (silicon oxide film, silicon nitride film, or silicon nitride oxide film), and then a thermal oxidation step is carried out to make the active layer thin and to decrease defects in grains.

Then, it is also possible to make such a structure that after the insulating film is once removed, a gate insulating film is newly formed. Incidentally, after the gate insulating film is newly formed, a thermal oxidation step may be carried out again.

[Embodiment 7]

Figure 18:
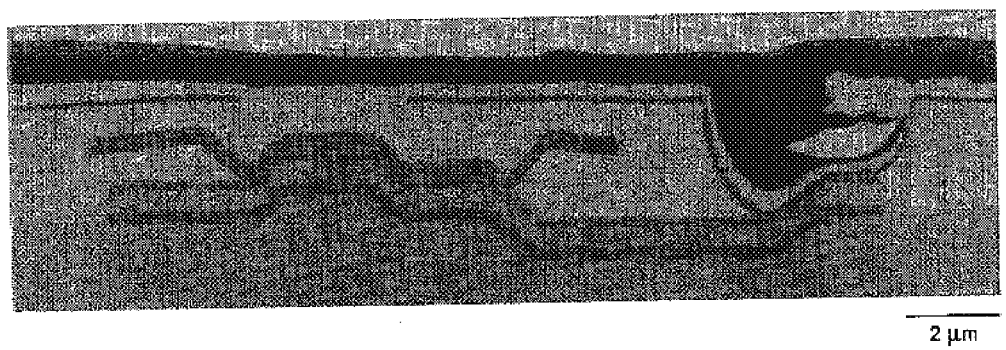
FIG. 18 is a TEM photograph showing a sectional structure of a pixel TFT of Embodiment 7.

In this embodiment, the pixel structure of the active matrix substrate shown in FIG. 3C will be described more concretely. FIG. 18 shows a sectional structure of a pixel TFT. FIG. 18 is a TEM photograph showing the section of the pixel TFT magnified 10 thousands times.

Figure 19A:
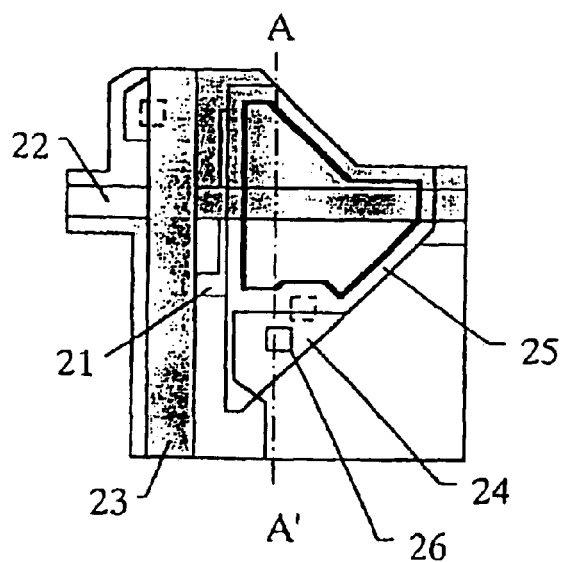
FIGS. 19A and 19B are views showing upper and sectional structures of a pixel TFT of Embodiment 7.

The TEM photograph shown in FIG. 18 is a sectional view taken along broken line A-A' in a top view of the pixel TFT shown in FIG. 19A. In FIG. 19A, reference numeral 21 denotes an active layer, 22 denotes a gate line, 23 denotes a source line, 24 denotes a drain electrode, 25 denotes a black mask, and 26 denotes a contact hole for connecting the drain electrode 24 to a pixel electrode 27.

The feature of this embodiment is that storage capacitance is formed between the drain electrode 24 and the black mask 25 over the pixel TFT.

Figure 19B:
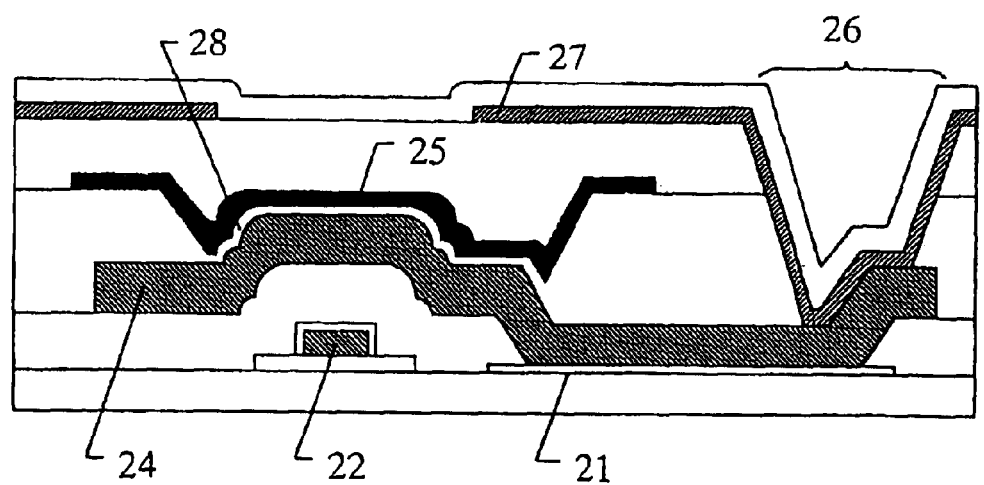

FIG. 19B is a view schematically showing the TEM photograph of FIG. 18. Common reference characters are used in FIG. 19A and FIG. 19B.

Like this, the drain electrode 24 is formed in an arrangement to overlap with the gate line 22, and the storage capacitance is formed between the drain electrode 24 and the black mask 25 opposite to the electrode through a dielectric layer 28. In this embodiment, a three-layer structure of an aluminum film sandwitched between titanium films is adopted for the drain electrode 24.

In the case of this embodiment, after the drain electrode 24 is formed, an interlayer insulating film of a three-layer structure made of a silicon nitride film/a silicon oxide film/an acrylic film is formed, and the black mask 25 is formed thereon.

At this time, before the formation of the black mask 25, an opening portion is formed by removing only the acrylic film at a region which subsequently becomes the storage capacitance. Then only the silicon oxide film and the silicon nitride film remain on the bottom of the opening portion, and the insulating layer made of this two-layer structure functions as the dielectric layer 28 of the storage capacitance.

[Embodiment 8]

Figure 5:
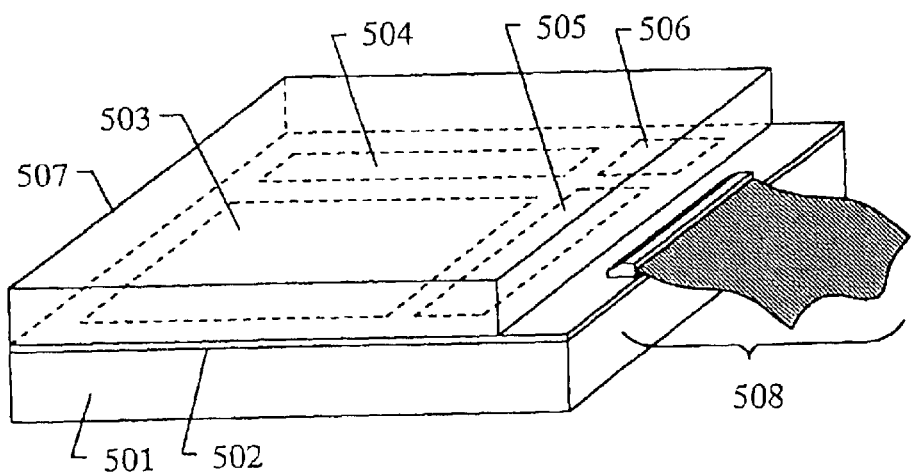
FIG. 5 is a view showing a structure of a liquid crystal module of Embodiment 8.

An example in which a liquid crystal display device is constituted by using the active matrix substrate having the structure shown in the embodiments 1 to 7, will be shown in FIG. 5. FIG. 5 shows a portion corresponding to the main body of the liquid crystal display device, and the portion is also called a liquid crystal module.

In FIG. 5, reference numeral 501 denotes a substrate (any of quartz, silicon wafer, and crystallized glass may be used), and 502 denotes an insulating film as an under film. on which a plurality of TFTs are formed from semiconductor films manufactured in accordance with the manufacturing steps of the present invention.

These TFTs constitute a pixel matrix circuit 503, a gate side driving circuit 504, a source side driving circuit 505, and a logic circuit 506 on the substrate. An opposite substrate 507 is bonded to such an active matrix substrate. A liquid crystal layer (not shown) is held between the active matrix substrate and the opposite substrate 507.

In the structure shown in FIG. 5, it is desirable that the side surfaces of the active matrix substrate and the side surfaces of the opposite substrate are made aligned with each other except one side. By doing so, the number of pieces taken out from a large substrate can be effectively increased.

On the one side, a part of the opposite substrate is removed to expose part of the active matrix substrate, and an FPC (Flexible Print Circuit) 508 is attached to the exposed part. As the need arises, an IC chip (semiconductor circuit formed on single crystal silicon and constituted by MOSFETs) may be put on the part. In general, what is called a liquid crystal module is a liquid crystal panel in the state where an FPC is attached.

Figure 20:
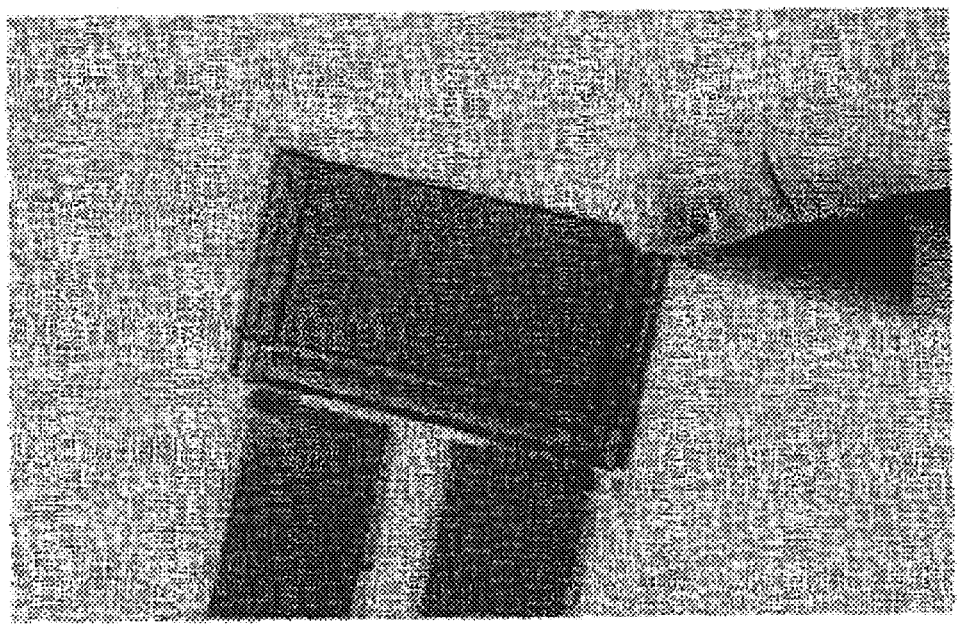
FIG. 20 is a photograph showing an outer appearance of a liquid crystal module of Embodiment 7.

FIG. 20 shows an example of a liquid crystal module experimentally formed by the present applicant. The specification is such that the size is 2.6 inches diagonal, the number of pixels is 1280×1024, and the pixel size is 45 $\mu m \times 32$ $\mu m$. Moreover, it is realized that the opening rate is 63%, and the ratio of contrast is 300:1.

In the liquid crystal module shown in FIG. 20, a signal processing circuit driven at a high frequency of several hundreds MHZ to several GHz as described in the embodiment 1 is integrally formed on the same substrate as a pixel matrix circuit. That is, the liquid crystal module shown in FIG. 20 realizes a system-on-panel.

In this embodiment, although the case where the present invention is applied to the liquid crystal display device is described, it is also possible to manufacture an active matrix type EL (electroluminescence) display device or the like. It is also possible to manufacture an image sensor, which is provided with a photoelectric conversion layer, and the like on the same substrate.

Incidentally, the electrooptical device is defined as a device having a function for converting an optical signal into an electric signal or converting an electric signal into an optical signal, such as the foregoing liquid crystal display device, EL display device, and image sensor. The present invention can be applied to any electro-optical device which can be formed by using a semiconductor thin film formed on a substrate having an insulating surface.

[Embodiment 9]

In the present invention, not only the electro-optical device as shown in the embodiment 8, but also a thin film integrated circuit (or semiconductor circuit) in which functional circuits are integrated, can be constituted. For example, it is also possible to constitute an arithmetic circuit such as a microprocessor, a high frequency circuit (MMIC: Microwave Module IC) for a portable equipment, and the like.

Moreover, by using the merits of a TFT using a thin film, it is also possible to constitute a semiconductor circuit of three-dimensional structure to constitute a VLSI circuit integrated with ultra high density. Like this, it is possible to constitute a semiconductor circuit with extremely high functionality by using TFTs of the present invention. Incidentally, in the present specification, the semiconductor circuit is defined as an electric circuit in which control and conversion of electric signals is carried out by using semiconductor characteristics.

[Embodiment 10]

In this embodiment, examples of electronic equipments (applied product) provided with an electro-optical device or a semiconductor circuit shown in the embodiments 8 or 9 will be described with reference to FIGS. 6A to 6F. Incidentally, the electronic equipment is defined as a product provided with a semiconductor circuit and/or an electrooptical device.

As the electronic equipments to which the present invention can be applied, a video camera, an electric still camera, a projector, a head mount display, a car navigation system, a personal computer, a portable information terminal (mobile computer, portable telephone, PHS (Personal Handyphone System) etc.) and the like are enumerated.

Figure 6A:
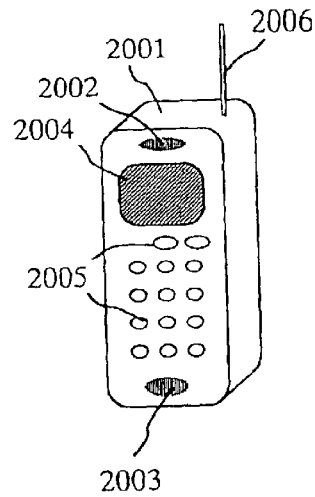
FIGS. 6A to 6F are views showing structures of electronic equipments of Embodiment 10.

FIG. 6A shows a portable telephone which is constituted by a main body 2001, an audio output portion 2002, an audio input portion 2003, a display device 2004, an operation switch 2005, and an antenna 2006. The present invention can be applied to the audio output portion 2002, the audio input portion 2003, the display device 2004, and the like.

Figure 6B:
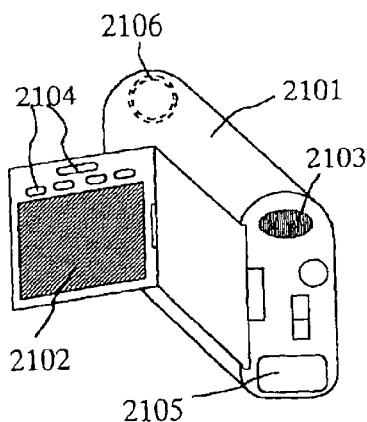

FIG. 6B shows a video camera which is constituted by a main body 2101, a display device 2102, an audio input portion 2103, an operation switch 2104, a battery 2105, and an image receiving portion 2106. The present invention can be applied to the display device 2102, the audio input portion 2103, the image receiving portion 2106, and the like.

Figure 6C:
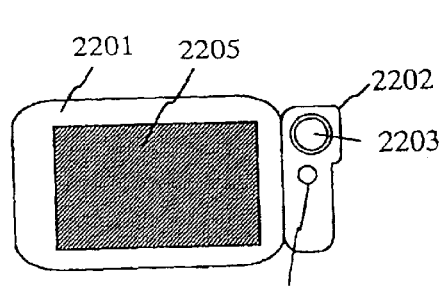

FIG. 6C shows a mobile computer which is constituted by a main body 2201, a camera portion 2202, an image receiving portion 2203, an operation switch 2204, and a display device 2205. The present invention can be applied to the camera portion 2202, the image receiving portion 2203, the display device 2205, and the like.

Figure 6D:
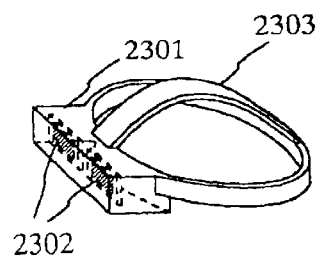

FIG. 6D shows a head mount display which is constituted by a main body 2301, a display device 2302, and a band portion 2303. The present invention can be applied to the display device 2302.

Figure 6E:
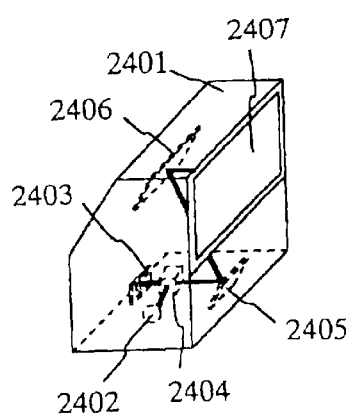

FIG. 6E shows a rear type projector which is constituted by a main body 2401, a light source 2402, a display device 2403, a polarizing beam splitter 2404, reflectors 2405 and 2406, and a screen 2407. The present invention can be applied to the display device 2403.

Figure 6F:
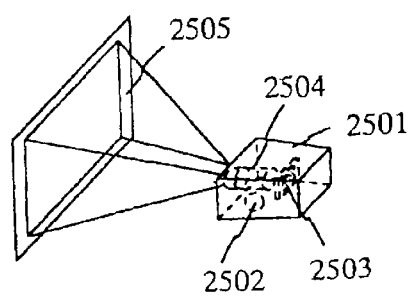

FIG. 6F shows a front type projector which is constituted by a main body 2501, a light source 2502, a display device 2503, an optical system 2504, and a screen 2505. The present invention can be applied to the display device 2503.

As described above, the scope of application of the present invention is very wide, and the present invention can be applied to electronic equipments of any field. Moreover, the present invention can be applied to any product as long as it requires an electrooptical device or a semiconductor circuit.

As described above, by practicing the present invention, it becomes possible to effectively remove a catalytic element used for crystallization of an amorphous semiconductor film after crystallization. Moreover, by carrying out a thermal oxidation step in the state where an active layer is protected by an insulting film (the state where the active layer is not brought into contact with an oxidizing atmosphere), it is possible to prevent abnormal growth of a metal oxide from occurring in the active layer.

In this way, it becomes possible to realize a semiconductor device with high performance by TFTs having excellent electrical characteristics which are realized by removing the catalytic element remaining in the crystalline silicon film.

What is claimed is:

1. A method of manufacturing a semiconductor device, said method comprising the steps of:

introducing a catalytic element for promoting crystallization of an amorphous semiconductor film into at least a portion of the amorphous semiconductor film;

converting the portion of the amorphous semiconductor film by a first heat treatment into a crystalline semiconductor film;

selectively adding an element selected from group 15 into an additional region of the crystalline semiconductor film;

gettering the catalytic element into the additional region from an adjacent region to the additional region by a second heat treatment;

forming an active layer by patterning the crystalline semiconductor film;

forming an insulating film covering the active layer; and carrying out a third heat treatment in an oxidizing atmosphere after forming the insulating film.

2. A method according to claim 1, wherein the catalytic element is at least one selected from the group consisting of Ni, Co, Fe, Pd, Pt, Cu, Au, Ge, and Pb.

3. A method according to claim 1, wherein the element selected from group 15 is one selected from the group consisting of phosphorus, arsenic, and antimony.

4. A method according to claim 1, wherein the element selected from group 15 has a concentration of $1 \times 10^{19}$ to $1 \times 10^{21}$ atoms/cm$^3$ in said additional region.

5. A method of manufacturing a semiconductor device, said method comprising the steps of:

introducing a catalytic element for promoting crystallization of an amorphous semiconductor film into the amorphous semiconductor film;

converting the amorphous semiconductor film into a crystalline semiconductor film by a first heat treatment;

selectively adding an element selected from group 15 into an additional region of the crystalline semiconductor film;

gettering the catalytic element into said additional region from an adjacent region to the additional region;

forming an active layer by patterning the crystalline semiconductor film;

forming an insulating film covering the active layer; and carrying out a third heat treatment in an oxidizing atmosphere after forming the insulating film.

6. A method according to claim 5, wherein the catalytic element is at least one selected from the group consisting of Ni, Co, Fe, Pd, Pt, Cu, Au, Ge, and Pb.

7. A method according to claim 5, wherein the element selected from group 15 is one selected from the group consisting of phosphorus, arsenic, and antimony.

8. A method according to claim 5, wherein the element selected from group 15 has a concentration of $1 \times 10^{19}$ to $1 \times 10^{21}$ atoms/cm$^3$ in said additional region.

* * * * *